(12) United States Patent
Koike

(10) Patent No.: US 8,188,599 B2
(45) Date of Patent: May 29, 2012

(54) SEMICONDUCTOR DEVICE, ITS MANUFACTURING METHOD, AND SPUTTERING TARGET MATERIAL FOR USE IN THE METHOD

(75) Inventor: Junichi Koike, Miyagi (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 971 days.

(21) Appl. No.: 11/912,393

(22) PCT Filed: Feb. 27, 2007

(86) PCT No.: PCT/JP2007/054134
§ 371 (c)(1),
(2), (4) Date: Jul. 1, 2008

(87) PCT Pub. No.: WO2007/100125
PCT Pub. Date: Sep. 7, 2007

(65) Prior Publication Data
US 2009/0212432 A1     Aug. 27, 2009

(30) Foreign Application Priority Data

| Feb. 28, 2006 | (JP) | 2006-052436 |
| Feb. 28, 2006 | (JP) | 2006-053851 |
| Jun. 5, 2006 | (JP) | 2006-156228 |
| Sep. 1, 2006 | (JP) | 2006-237325 |
| Oct. 12, 2006 | (JP) | 2006-278461 |
| Nov. 24, 2006 | (JP) | 2006-316958 |

(51) Int. Cl.
*H01L 23/48* (2006.01)
*H01L 23/52* (2006.01)
*H01L 29/40* (2006.01)

(52) U.S. Cl. ............... 257/751; 257/762; 257/E21.021; 257/E21.584

(58) Field of Classification Search .................. 257/751, 257/762, E21.021, E21.584
See application file for complete search history.

(56) References Cited

U.S. PATENT DOCUMENTS
6,107,188 A * 8/2000 Liu et al. .................. 438/633
(Continued)

FOREIGN PATENT DOCUMENTS
JP      H05-47760 A     2/1993
(Continued)

OTHER PUBLICATIONS

Koike et al., Self-forming diffusion barrier layer in Cu-Mn alloy metallization, Applied Physics Letters, 87, 041911, 2005, pp. 1-3.*

(Continued)

*Primary Examiner* — Steven Loke
*Assistant Examiner* — Earl Taylor
(74) *Attorney, Agent, or Firm* — Sughrue Mion, PLLC

(57) ABSTRACT

A semiconductor device enables a barrier layer to fully acquire a barriering property against the diffusion of Cu from a wiring main body and the diffusion of Si from an insulating film, enhances the adhesiveness of the barrier layer and the insulating film and excels in reliability of operation over a long period of time. In this invention, a semiconductor device 1 provided on an insulating film 3 with a wiring includes the insulating film 3 containing silicon (Si), a wiring main body 8 formed of copper (Cu) in a groove-like opening 4 disposed in the insulating film 3, and a barrier layer 7 formed between the wiring main body 8 and the insulating film 3 and made of an oxide containing Cu and Si and Mn in such a manner that the atomic concentration of Cu decreases monotonously from the wiring main body 8 side toward the insulating film 3 side, the atomic concentration of Si decreases monotonously from the insulating film 3 side toward the wiring main body 8 side, and the atomic concentration of Mn is maximized in the region in which the atomic concentration of Cu and the atomic concentration of Si are approximately equal.

29 Claims, 15 Drawing Sheets

U.S. PATENT DOCUMENTS

| | | | |
|---|---|---|---|
| 6,265,319 B1* | 7/2001 | Jang | 438/723 |
| 6,451,685 B1* | 9/2002 | Ahn et al. | 438/622 |
| 6,541,919 B1* | 4/2003 | Roach et al. | 315/169.3 |
| 6,555,477 B1* | 4/2003 | Lu et al. | 438/692 |
| 6,593,656 B2* | 7/2003 | Ahn et al. | 257/762 |
| 6,599,829 B2* | 7/2003 | Smith et al. | 438/636 |
| 6,638,853 B1* | 10/2003 | Sue et al. | 438/633 |
| 6,720,262 B2* | 4/2004 | Koh et al. | 438/687 |
| 6,734,079 B2* | 5/2004 | Huang et al. | 438/396 |
| 6,734,110 B1* | 5/2004 | Jang et al. | 438/706 |
| 6,876,082 B2* | 4/2005 | Lee et al. | 257/763 |
| 6,930,052 B2* | 8/2005 | Schwarzl et al. | 438/738 |
| 6,944,032 B1* | 9/2005 | Steffensmeier et al. | 361/803 |
| 7,081,406 B2* | 7/2006 | Lo et al. | 438/620 |
| 7,187,084 B2* | 3/2007 | Jang et al. | 257/774 |
| 7,285,853 B2* | 10/2007 | Liu | 257/734 |
| 7,304,384 B2* | 12/2007 | Koike et al. | 257/751 |
| 7,309,658 B2* | 12/2007 | Lazovsky et al. | 438/754 |
| 7,345,342 B2* | 3/2008 | Challa et al. | 257/341 |
| 7,480,990 B2* | 1/2009 | Fitzsimmons et al. | 29/846 |
| 7,507,666 B2 | 3/2009 | Nakao et al. | |
| 7,626,665 B2* | 12/2009 | Koike | 349/139 |
| 7,638,829 B2* | 12/2009 | Hayashi et al. | 257/304 |
| 7,642,552 B2* | 1/2010 | Koike et al. | 257/59 |
| 2001/0019891 A1* | 9/2001 | Koh et al. | 438/687 |
| 2002/0106890 A1* | 8/2002 | Ahn et al. | 438/622 |
| 2002/0127840 A1* | 9/2002 | Smith et al. | 438/618 |
| 2003/0098434 A1* | 5/2003 | Li et al. | 252/62 |
| 2003/0193090 A1* | 10/2003 | Otani et al. | 257/758 |
| 2004/0009668 A1* | 1/2004 | Catabay et al. | 438/689 |
| 2004/0029377 A1* | 2/2004 | Lee et al. | 438/637 |
| 2004/0101988 A1* | 5/2004 | Roman et al. | 438/40 |
| 2004/0147100 A1* | 7/2004 | Jang et al. | 438/584 |
| 2004/0147112 A1* | 7/2004 | Tsu et al. | 438/637 |
| 2004/0214442 A1* | 10/2004 | Lee et al. | 438/692 |
| 2005/0051900 A1* | 3/2005 | Liu et al. | 257/757 |
| 2005/0156316 A1* | 7/2005 | Lee et al. | 257/751 |
| 2005/0159005 A1* | 7/2005 | Shirasu et al. | 438/692 |
| 2005/0167742 A1* | 8/2005 | Challa et al. | 257/328 |
| 2005/0218519 A1* | 10/2005 | Koike et al. | 257/756 |
| 2006/0035457 A1* | 2/2006 | Carter et al. | 438/624 |
| 2006/0091536 A1* | 5/2006 | Huang et al. | 257/734 |
| 2006/0108320 A1* | 5/2006 | Lazovsky et al. | 216/2 |
| 2006/0160027 A1* | 7/2006 | Niwa et al. | 430/312 |
| 2006/0183346 A1* | 8/2006 | Liu | 438/778 |
| 2006/0208360 A1* | 9/2006 | Yiu et al. | 257/750 |
| 2006/0254502 A1* | 11/2006 | Garrou et al. | 117/84 |
| 2007/0001307 A1* | 1/2007 | Usui et al. | 257/758 |
| 2007/0002239 A1* | 1/2007 | Koike | 349/139 |
| 2007/0004049 A1* | 1/2007 | Nasu et al. | 438/3 |
| 2007/0045851 A1* | 3/2007 | Kitada et al. | 257/758 |
| 2007/0057302 A1* | 3/2007 | Ho et al. | 257/301 |
| 2007/0161290 A1* | 7/2007 | Fitzsimmons et al. | 439/607 |
| 2007/0170483 A1* | 7/2007 | Hayashi et al. | 257/296 |
| 2009/0212432 A1* | 8/2009 | Koike | 257/751 |

FOREIGN PATENT DOCUMENTS

| | | |
|---|---|---|
| JP | 6 140398 | 5/1994 |
| JP | 6 310509 | 11/1994 |
| JP | 2001-44156 A | 2/2001 |
| JP | 2002-285373 A | 10/2002 |
| JP | 2005-277390 A | 10/2005 |
| JP | 2006 73863 | 3/2006 |
| WO | WO 2007100125 A1 * | 9/2007 |

OTHER PUBLICATIONS

Kazuo Yasuda and Kichinosuke Hirokawa, Highly Sensitive Atomic Absorption Optical Emission Analyses, p. 20-21/100-107/202, published by Kodansha Ltd. in Japan.

Duffy Inorganic Chemistry, translated by Masatake Honda, p. 204-205/262-267, published by Hirokawa Shoten Co., Ltd. in Japan.

* cited by examiner

SEMICONDUCTOR DEVICE, ITS MANUFACTURING METHOD, AND SPUTTERING TARGET MATERIAL FOR USE IN THE METHOD

TECHNICAL FIELD

This invention relates to a semiconductor device having a wiring disposed on an insulating film, a method for the fabrication thereof, and a sputtering target for use in the fabrication method.

BACKGROUND ART

For the purpose of configuring a silicon (Si) semiconductor device, such as an integrated circuit (IC), or an electronic device, such as a liquid crystal display (LCD), it is necessary to configure a wiring that is formed of a material having low resistance and high electroconductivity. The configuration of a silicon large-scale integration (VLSI) necessitates a fine wiring technology for the purpose of enhancing the degree of integration. Recently, for the wiring for use in the silicon VLSI and the LCD, copper (Cu) that has lower resistance and higher migration resistance than aluminum alloy is preferably used (refer to Patent Document 1 shown below).

Patent Document 1: JP-A HEI 5-47760

Since the copper that forms the wiring is diffused in a neighboring insulating film, it is necessary to form a layer, such as of tantalum (Ta) or a nitride thereof (TaN), as a barrier layer serving to suppress this diffusion of Cu (refer to Patent Document 2 shown below).

Patent Document 2: JP-A 2001-44156

On the other hand, in the semiconductor device, such as a large-scale integration (LSI), the increase of the degree of integration requires the wiring to decrease its width. The decrease of the width of the wiring, however, entails such problems as increasing the ratio of the thickness of the barrier layer of high resistance occupied in the width of the wiring and, when the barrier layer is disposed as disclosed in Patent Document 2, inevitably increasing the effective resistance of the wiring.

Recently, unlike the conventional technique that forms a barrier layer of Ta or TaN, the technique that heats a film of Cu alloy, such as an alloy of Cu and manganese (Mn) (Cu—Mn-based alloy), deposited on an insulating film to self-matchingly form a barrier layer between a copper wiring and the insulating film has been disclosed (refer to Patent Document 3 shown below).

Patent Document 3: JP-A 2005-277390

The conventional barrier layer formed using a Cu alloy, however, has entailed the following problems.

(1) Since no sufficient barrier property against the diffusion of Cu from the wiring side can be secured, the Cu is diffused toward the insulating film side and the insulating film is prevented from securing the insulating property.

(2) Owing to the mutual diffusion, the Si on the insulating film side is diffused toward the wiring side and the resistance on the wiring side is inevitably increased.

(3) Owing to the deficiency in the adhesiveness between the barrier layer and the insulating film, the semiconductor device excelling in lasting reliability of operation cannot be configured.

The problems enumerated above are thought to be ascribable to the failure to make clear the configuration of a barrier layer that enables enhancing the adhesion with an insulating film and as well bringing about a sufficient barrier property against the diffusion of Cu and Si.

DISCLOSURE OF THE INVENTION

This invention has been perfected in view of the true state of affairs mentioned above and is aimed at providing a semiconductor device imparting to a barrier layer a thorough barriering action against the diffusion of Cu from the wiring main body side and the diffusion of Si from the insulating film side, thereby ensuring the insulating property of the insulating film and realizing the lowering of the resistance of the wiring, enhancing the adhesiveness between the barrier layer and the insulating film, and exhibiting the excellent reliability of the operation for a long time, a method for the fabrication thereof, and a sputtering target for use in the fabrication method.

To attain the above object, the present invention provides (1) as the first aspect thereof a semiconductor device provided on an insulating film with a wiring, comprising an insulating film containing silicon, a wiring main body formed of copper (Cu) in a groove-like opening formed in the insulating film, and a barrier layer formed between the insulating film and the wiring main body and made of an Mn-based oxide having the atomic concentration of manganese (Mn) maximized in a central part in a thickness direction.

(2) The second aspect of the invention is directed to the configuration of the first aspect, wherein the barrier layer has Cu contained therein.

(3) The third aspect of the invention is directed to the configuration of the second aspect, wherein the Cu contained in the barrier layer has an atomic concentration monotonously decreased from the wiring main body toward the insulating film.

(4) The fourth aspect of the invention is directed to the configuration of the third aspect, wherein the Cu contained in the barrier layer has an atomic concentration of not more than an atomic concentration of Mn in the central part in the thickness direction of the barrier layer.

(5) The present invention provides as the fifth aspect thereof a semiconductor device provided on an insulating film with a wiring, comprising an insulating film containing silicon, a wiring main body formed of copper (Cu) in a groove-like opening formed in the insulating film, and a barrier layer formed between the insulating film and the wiring main body and made of an oxide containing Cu, Si and Mn in such a manner that the Cu has an atomic concentration decreasing monotonously from the wiring main body toward the insulating film, the Si has an atomic concentration decreasing monotonously from the insulating film toward the wiring main body, and Mn has an atomic concentration maximized in a region in which the atomic concentration of Cu and the atomic concentration of Si are approximately equal.

(6) The sixth aspect of the invention is directed to the configuration of the fifth aspect, wherein the atomic concentration of Mn in the region of the barrier layer in which the atomic concentrations of Cu and Si therein are approximately equal is not less than twice the atomic concentration of Cu or Si.

(7) The seventh aspect of the invention is directed to the configuration of any one of the first to sixth aspects, wherein the barrier layer has a thickness of not less than 1 nm, not more than 1/5 of a width of the groove-like opening and not more than 10 nm.

(8) The eighth aspect of the invention is directed to the configuration of any one of the first to seventh aspects, wherein the barrier layer is made of an amorphous substance.

(9) The ninth aspect of the invention is directed to the configuration of any one of the first to eighth aspects, further comprising Mn ionized to divalent or trivalent state that exists on the wiring main body contiguous to the barrier layer.

(10) The tenth aspect of the invention provides a method for the fabrication of a semiconductor device provided on an insulating film with a wiring, comprising the steps of disposing a groove-like opening in an insulating film containing silicon (Si), forming on an inner peripheral surface of the opening a copper alloy film containing manganese (Mn) and copper (Cu), embedding Cu in the opening having formed therein the copper alloy film, thereby forming a copper embedded layer, and performing a heat treatment, thereby forming a barrier layer between the copper alloy film and the insulating film and integrating the copper alloy film with the Cu of the copper embedded layer to produce a wiring main body, wherein the barrier layer is formed of an Mn-based oxide having an atomic concentration of Mn maximized in a central part in a thickness direction.

(11) The $11^{th}$ aspect of the invention provides a method for the fabrication of a semiconductor device provided on an insulating film with a wiring, comprising the step of disposing a groove-like opening in an insulating film containing silicon (Si), forming on an inner peripheral surface of the opening a copper alloy film containing manganese (Mn) and copper (Cu), embedding Cu in the opening having formed therein the copper alloy film, thereby forming a copper embedded layer, and performing a heat treatment, thereby forming a barrier layer between the copper alloy film and the insulating film and integrating the copper alloy film with the Cu of the copper embedded layer to produce a wiring main body, wherein the barrier layer is formed of an oxide containing Cu, Si and Mn in such a manner that the Cu has an atomic concentration decreased monotonously from the wiring main body toward the insulating film, the Si has an atomic concentration decreased monotonously from the insulating film toward the wiring main body, and the Mn has an atomic concentration maximized in a region in which the atomic concentration of Cu and the atomic concentration of Si are approximately equal.

(12) The $12^{th}$ aspect of the invention is directed to the method for the fabrication of a semiconductor device according to the tenth or $11^{th}$ aspect, wherein the heat treatment is performed in a flow of either a pure inert gas inevitably containing oxygen or an inert gas containing oxygen at a concentration of 75 vol. ppm at most.

(13) The $13^{th}$ aspect of the invention is directed to the method for the fabrication of a semiconductor device according to the tenth or $11^{th}$ aspect, wherein the heat treatment is performed in a flow of either nitrogen or hydrogen gas inevitably containing oxygen, or nitrogen or hydrogen gas containing oxygen at a concentration of 75 vol. ppm at most.

(14) The $14^{th}$ aspect of the invention is directed to the method for the fabrication of a semiconductor device according to any one of the tenth to $13^{th}$ aspects, wherein the heat treatment is performed at a temperature of not less than 150° C. and not more than 600° C.

(15) The $15^{th}$ aspect of the invention is directed to the method for the fabrication of a semiconductor device according to any one of the tenth to $13^{th}$ aspects, wherein the heat treatment is performed at a temperature of not less than 150° C. and not more than 450° C.

(16) The $16^{th}$ aspect of the invention is directed to the method for the fabrication of a semiconductor device according to any one of the tenth to $15^{th}$ aspects, wherein the step of forming the copper alloy film is taken by subjecting a sputtering target material to sputtering.

(17) The $17^{th}$ aspect of the invention is directed to a sputtering target material to be used for the method for the fabrication of a semiconductor device according to the $16^{th}$ aspect and adapted to form the copper alloy film by performing sputtering, comprising copper (Cu) as a main component, manganese (Mn) as an essential element and unavoidable impurities inevitably remaining in the Cu excluding the essential element, wherein the unavoidable impurities consist of one of eight groups in a total content of not more than 0.1% as an atomic concentration based on the target material, a first group consisting of lithium (Li), a second group consisting of beryllium (Be), calcium (Ca) and magnesium (Mg), a third group consisting of boron (B), gallium (Ga) and aluminum (Al), a fourth group consisting of silicon (Si), a fifth group consisting of antimony (Sb), a sixth group consisting of principal transition metals including scandium (Sc), titanium (Ti), vanadium (V), chromium (Cr), iron (Fe), cobalt (Co), nickel (Ni), yttrium (Y), zirconium (Zr), niobium (Nb), molybdenum (so), technetium (Tc), ruthenium (Ru), palladium (Pd), hafnium (Hf), tantalum (Ta), tungsten (W), rhenium (Re), osmium (Os), iridium (fr), platinum (Pt) and gold (Au), a seventh group consisting of inner transition metals of lanthanide series including lanthanum (La), cesium (Ce), samarium (Sm), gadolinium (Gd), terbium (Th), dysprosium (Dy), holmium (Ho), erbium (Er), thulium (Tm), ytterbium (Yb) and lutetium (Lu), and an eighth group consisting of thorium (Th).

(18) The $18^{th}$ aspect of the invention is directed to a sputtering target material to be used for the method for the fabrication of a semiconductor device according to the $16^{th}$ aspect and adapted to form the copper alloy film by performing sputtering, comprising copper (Cu) as a main component, manganese (Mn) as an essential element and unavoidable impurities inevitably remaining in the Cu excluding the essential element, wherein the unavoidable impurities consists, in a total content of not more than 0.1% as an atomic concentration based on the target material, of any one of lithium (Li), beryllium (Be), calcium (Ca), magnesium (Mg), boron (B), gallium (Ga), aluminum (Al), silicon (Si), antimony (Sb), scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), tantalum (Ta), tungsten (W), rhenium (Re), osmium (Os), iridium (Ir), platinum (Pt), gold (Au), lanthanum (La), cesium (Ce), samarium (Sm), gadolinium (Gd), terbium (Th), dysprosium (Dy), holmium (Ho), erbium (Er), thulium (Tm), ytterbium (Yb), lutetium (Lu) and thorium (Th).

(19) The $19^{th}$ aspect of the invention is directed to a sputtering target material according to any one of the $16^{th}$ to $18^{th}$ aspects, wherein the Mn as the essential element has a content of not less than 0.5% and not more than 20% as an atomic concentration based on the target material.

According to the first or tenth aspect of the invention, a barrier layer formed of an Mn-based oxide and having the atomic concentration of Mn maximized in the central part of the layer thickness, namely a barrier layer formed of an Mn-based oxide and having Mn concentrated in the central part of the layer thickness, is interposed between the insulating film and the wiring main body. This barrier layer, by reason of its low formation energy, exhibits thermal stability, forms a structurally compact layer and constitutes an effective configuration for the sake of suppression of diffusion. Thus, it eventually acquires an excellent barrier property against diffusion of Cu from the wiring main body side and enables the insulating film to excel in the insulating property. Further, it eventually acquires an excellent barrier property against the diffusion of Si from the insulating film side and enables the wiring main body to exhibit low resistance. The semiconductor device aimed at, therefore, is enabled to merit low electric power consumption because of the provision of the wiring that exhibits low resistance and permits prevention of the leakage of the operating current of the device.

Then, according to the second aspect of the invention, since the barrier layer is made to be a Cu-containing layer, it is enabled to enhance the adhesiveness thereof with the Cu film fated to be formed contiguously with the surface of the barrier layer and destined to constitute the wiring main body and permit the semiconductor device to excel in the reliability of operation over a long time because the atomic concentration distribution does not change abruptly between the barrier layer and the wiring main body having Cu as a main component and the concentration of Cu is continuously varied.

Then, according to the third aspect of the invention, since the atomic concentration of Cu in the barrier layer is monotonously decreased from the side of the wiring main body having Cu as a main component toward the insulating film side, it is enabled to further enhance the adhesiveness thereof with the Cu film constituting the main body of the wiring and permit the semiconductor device to excel in the reliability of operation over a long time because the atomic concentration distribution does not change abruptly between the barrier layer and the wiring main body having Cu as a main component and the concentration of Cu is continuously varied.

Then, according to the fourth aspect of the invention, since the atomic concentration of the Cu contained in the barrier layer is made to be smaller than the atomic concentration of Mn in the central part in the direction of the thickness of the layer, the Mn oxide becomes to exhibit slow diffusion and the barrier layer is eventually formed of the oxide having the Mn as its main component because the barrier layer is eventually made to assume Mn as its main component element and this Mn exhibits a strong binding force with oxygen. The barrier layer, therefore, exhibits an excellent barrier property against the diffusion of Cu from the wiring main body side.

According to the fifth or $11^{th}$ aspect of the invention, since the barrier layer formed of an oxide containing Cu, Si and Mn is formed between the wiring main body and the insulating film and since this barrier layer has the atomic concentration of Cu monotonously decreasing from the wiring main body side toward the insulating film side, the atomic concentration of Si monotonously decreasing from the insulating film toward the wiring main body side and the atomic concentration of Mn maximizing in the region in which the atomic concentrations of Cu and Si become approximately equal, the barrier layer becomes the layer of a thermally stable and structurally compact oxide. The barrier layer, therefore, assumes a structure effective for the sake of suppressing the diffusion, acquires an excellent barrier property against the diffusion of Cu from the wiring main body side and enables the insulating film to excel further in the insulating property. It eventually acquires an excellent barrier property against the diffusion of Si from the insulating film side and enables the wiring main body to exhibit still lower resistance. The semiconductor device, by thus being provided with the wiring that exhibits low resistance and possesses the ability to prevent leakage of the operating current of the device, merits more lowered electric power consumption.

Further, since the barrier layer has the atomic concentration of Cu therein monotonously decreasing from the side of the wiring main body having Cu as a main component toward the insulating film side, it enables enhancement of the adhesiveness thereof with the Cu film constituting the wiring main body and allows the semiconductor device to excel in the reliability of operation over a long time because the atomic concentration distribution is not broken between the barrier layer and the wiring main body having Cu as a main component and the concentration of Cu is continuously varied.

Further, the barrier layer has the boundary face thereof with the insulating film consisting of an oxide mainly containing Si and Mn in consequence of the reaction of diffusion and the atomic concentration of Si in the barrier layer monotonously decrease from the insulating film toward the wiring main body side. Thus, the Si composition distribution from the insulating film describes a continuous pattern instead of a precipitous and discontinuous pattern in the boundary face with the barrier layer. The interfacial strength between the insulating film and the barrier layer can be increased and the adhesiveness with the insulating film can be enhanced. Even from this point of view, the semiconductor device is enabled to excel in the reliability of the operation over a long time.

Thus, the fifth or $11^{th}$ aspect of the invention can realize the lowering of the electric power consumption of the semiconductor device by lowering the resistance of the wiring main body and enhancing the insulating property of the insulating film and as well enables the semiconductor device to excel in the reliability of operation over a long time by enhancing the adhesiveness between the barrier layer and the wiring main body and enhancing the adhesiveness between the barrier layer and the insulating film.

Then, the sixth aspect of the invention causes the atomic concentration of Mn, in the region in which the atomic concentrations of Cu and Si are approximately equal, to become not less than twice as high as the atomic concentration of Cu or Si. The barrier layer, therefore, becomes an oxide having Mn as a main component and the growth of this barrier layer conforms to the law of logarithms of the time in contrast to the oxide that has Cu or Si as a main component and consequently continues to grow continuously. This conformity to the law of logarithms may be possibly described by the following supposition. Since the oxide of the barrier layer having Mn as a main component possesses a compact structure and generates slow diffusion, the growth of this oxide is not induced by the ordinary thermal diffusion. The free electrons accompanying the Mn atoms are tunnel-transferred to the side opposite the barrier layer (the insulating film side) to begin the presence of the ionized Mn on the wiring main body side contiguous to the barrier layer, with the result that electric fields will be formed on either side of the barrier layer 7 in the process of formation. The acceleration of the diffusion of Mn ions in the barrier layer that is caused by the electric fields initiates the growth of the oxide having Mn as a main component. Owing to this behavior of growth, the speed of the growth of the barrier layer is made to conform to the law of logarithms. As a result, the thickness of the barrier layer suddenly increases during the initial stage of the formation of the barrier layer, the speed of change of the thickness is slowed with the elapse of time, and the growth is suppressed and prevented from exceeding several nm. The barrier layer, therefore, becomes a coating formed of a thermally stable and structurally compact Mn oxide and constitutes a structure effective for the sake of suppressing the diffusion. As a result, the barriering action of the barrier layer against the diffusion of Cu from the wiring main body side and the diffusion of Si from the insulating film side can be further enhanced and the insulating property of the insulating film and the capacity of the wiring to lower resistance can be further enhanced.

Then, the seventh aspect of the invention can ensure the barriering action of the barrier layer against the diffusion of Cu from the wiring main body side and the diffusion of Si from the insulating film side because it enables the barrier layer to secure a thickness of not less than 1 nm or not more than ⅕ of the groove width of the opening. At the same time, it can infallibly prevent such harmful effects as causing the wiring main body to be narrowed by the barrier layer and consequently adding to the effective electric resistance of the wiring because the thickness of the barrier layer is set to be 10 nm at most. It, therefore, enables the insulating film to acquire the insulating property and the wiring to acquire the capacity to lower resistance with greater infallibility.

The eighth aspect of the invention can suppress the anomalous diffusion of Cu and Si via the grain boundary because it has the barrier layer formed in an amorphous state. It, therefore, can enhance the barriering action of the barrier layer and can infallibly retain the insulating property of the insulating film and the capacity of the wiring to lower resistance.

Then, the ninth aspect of the invention allows the presence of a positive electric charge on the wiring main body side adjoining the barrier layer and enables formation of electric fields between the wiring main body and the insulating film side opposite thereto across the barrier layer because of the presence of a divalent or trivalent ionized Mn on the wiring main body side adjoining the barrier layer. Since the electric fields formed on either side of the barrier layer attract the wiring main body and the insulating film toward the barrier layer, the effect of enhancing the adhesiveness of the grain boundary can be attained and the semiconductor device can be rendered excellent in the reliability of operation over a long time.

Then, the $12^{th}$ aspect of the invention allows the alloy elements, such as Mn, that have shunned formation of the barrier layer and have diffused and migrated as far as the surface of the wiring main body to be oxidized with a minute amount of oxygen contained properly in the inert gas and dissipated from the interior of the wiring main body in the form of the surface oxide of the wiring main body because the heat treatment is carried out in a pure inert gas inevitably containing oxygen or in an inert gas containing oxygen at a ratio of 75 vol. ppm at most. As a result, the resistance of the wiring approximately equals that of pure Cu and the wiring main body having low resistance can be obtained.

The $13^{th}$ aspect of the invention contemplates performing the heat treatment in a nitrogen gas or a hydrogen gas inevitably containing oxygen or in a nitrogen gas or a hydrogen gas containing oxygen in a ratio of 75 vol. ppm at most. The nitrogen gas or the hydrogen gas does not react with copper similarly to the inert gas. When the heat treatment is carried out in the nitrogen gas or the hydrogen gas, the alloy elements, such as Mn, that have shunned formation of the barrier layer and have diffused and migrated as far as the surface of the wiring main body, similarly to the case of the heat treatment performed in the inert gas, are oxidized with a minute amount of oxygen contained properly in the nitrogen gas or the hydrogen gas, allowed to form an oxide on the surface of the wiring main body and dissipated from the interior of the wiring main body in the form of a surface oxide of the wiring main body. As a result, the resistance of the wiring approximately equals that of pure Cu and the wiring main body having low resistance body can be obtained. Further, because of the use of the nitrogen gas or the hydrogen gas that is available at low cost, the heat treatment can be carried out at low cost.

The $14^{th}$ aspect of the invention can bring about such various effects as lowering the resistance of the wiring main body, enhancing the insulating property of the insulating film and enhancing the adhesiveness of the wiring main body and the insulating film, because it contemplates performing the heat treatment at a temperature of not less than 150° C. and not more than 600° C. and imparting to the barrier layer a structure peculiar to this invention.

The $15^{th}$ aspect of the invention can stably form the barrier layer in an amorphous state because it contemplates performing the heat treatment at a temperature of not less than 150° C. and not more than 450° C.

According to the $17^{th}$ aspect of the invention, the sputtering target material to be used for forming the copper alloy film by performing sputtering comprises copper (Cu) as a main component, manganese (Mn) as an essential element and unavoidable impurities inevitably remaining in the Cu excluding the essential element, wherein the unavoidable impurities consist of one of eight groups in a total content of not more than 0.1% as an atomic concentration based on the target material. The wiring main body formed of this sputtering target material, therefore, is enabled to exhibit low resistance and excellent conductivity and the semiconductor device is enabled to merit low electric power consumption.

According to the $18^{th}$ aspect of the invention, the sputtering target material to be used for forming the copper alloy film by performing sputtering comprises copper (Cu) as a main component, manganese (Mn) as an essential element and unavoidable impurities inevitably remaining in the Cu excluding the essential element, wherein the unavoidable impurities consists, in a total content of not more than 0.1% as an atomic concentration based on the target material, of any one of the specified elements. The wiring main body formed of this sputtering target material, therefore, is enabled to exhibit low resistance and excellent conductivity and the semiconductor device is enabled to merit low electric power consumption.

Specifically, (a) when the free energy for the sake of forming the oxide is larger than $SiO_2$ and the unavoidable impurity having a high binding reactivity with oxygen is present in the Cu alloy film, this unavoidable impurity is easily combined with oxygen and converted into an oxide and finally incorporated into the wiring main body and allowed to increase the electric resistance of the wiring main body. The $17^{th}$ and $18^{th}$ aspects of the invention, however, enable imparting low resistance and excellent conductivity to the wiring main body because they specify this unavoidable impurity and define virtually no inclusion of the unavoidable impurity in the sputtering target material.

Then, (b) when the unavoidable impurity whose diffusion coefficient in Cu is smaller than the Cu's own diffusion coefficient is present in the Cu alloy film, this unavoidable impurity has a strong inclination to survive in the Cu because of slow diffusion in Cu and is finally incorporated in the wiring main body and made to heighten the electric resistance thereof. The $17^{th}$ and $18^{th}$ aspects of the invention, however, enable imparting low resistance and excellent conductivity to the wiring main body because they specify this unavoidable impurity and define virtually no inclusion of the unavoidable impurity in the sputtering target material.

(c) When the unavoidable impurity capable of forming an intermetallic compound with Cu is present in the Cu alloy film, this unavoidable impurity is finally incorporated in the wiring main body and made to increase the electric resistance thereof. The $17^{th}$ and $18^{th}$ aspects of the invention, however, enable imparting low resistance and excellent conductivity to the wiring main body because they specify this unavoidable impurity and define virtually no inclusion of the unavoidable impurity in the sputtering target material.

Then, (d) when the unavoidable impurity capable of forming an intermetallic compound with Mn is present in the Cu alloy film, this unavoidable impurity is finally incorporated in the wiring main body and made to increase the electric resistance thereof. The 17$^{th}$ and 18$^{th}$ aspects of the invention, however, enable imparting low resistance and excellent conductivity to the wiring main body because they specify this unavoidable impurity and define virtually no inclusion of the unavoidable impurity in the sputtering target material.

The 17th and 18th aspects of the invention contemplate having manganese (Mn) contained as an essential element in the sputtering target material. The barrier layer obtained by heat-treating the Cu alloy film formed of this sputtering target material is made to form an Mn-based oxide coating. This Mn-based oxide coating serves as an excellent barrier layer against the diffusion of Cu from the wiring main body side, enables enhancing the adhesiveness with the insulating film and realizes lowering the electric power consumption of the semiconductor device and enhancing the reliability thereof.

The 19$^{th}$ aspect of the invention enables forming the barrier layer that abounds with adhesiveness and excels in barriering property as well because it contemplates fixing the content of Mn as an essential element for the sputtering target material in an appropriate range of not less than 0.5% and not more than 20% of the whole target material in terms of an atomic concentration. If the Mn content falls short of 0.5%, the barrier layer having a thickness of not more than 1 nm will be barely formed in part of the interface and the barriering property against diffusion and the adhesiveness of the interface will not be secured because the amount of Mn necessary for forming the barrier layer is unduly small. If the Mn content exceeds 20%, the thickness of the barrier layer will exceed 10 nm, the ratio of the thickness of the barrier layer will increase, and the effective resistance of the wiring will increase as well because the amount of Mn is unduly large.

BRIEF DESCRIPTION OF THE DRAWINGS

FIG. 1(a) depicting the former half of the procedure of fabrication and FIG. 1(b) depicting the latter half of the procedure of fabrication.

BEST MODE OF EMBODYING THE INVENTION

Now, the embodiment of this invention will be described in detail below by reference to the accompanying drawings. First, the first embodiment and examples thereof will be described.

Figure 1:
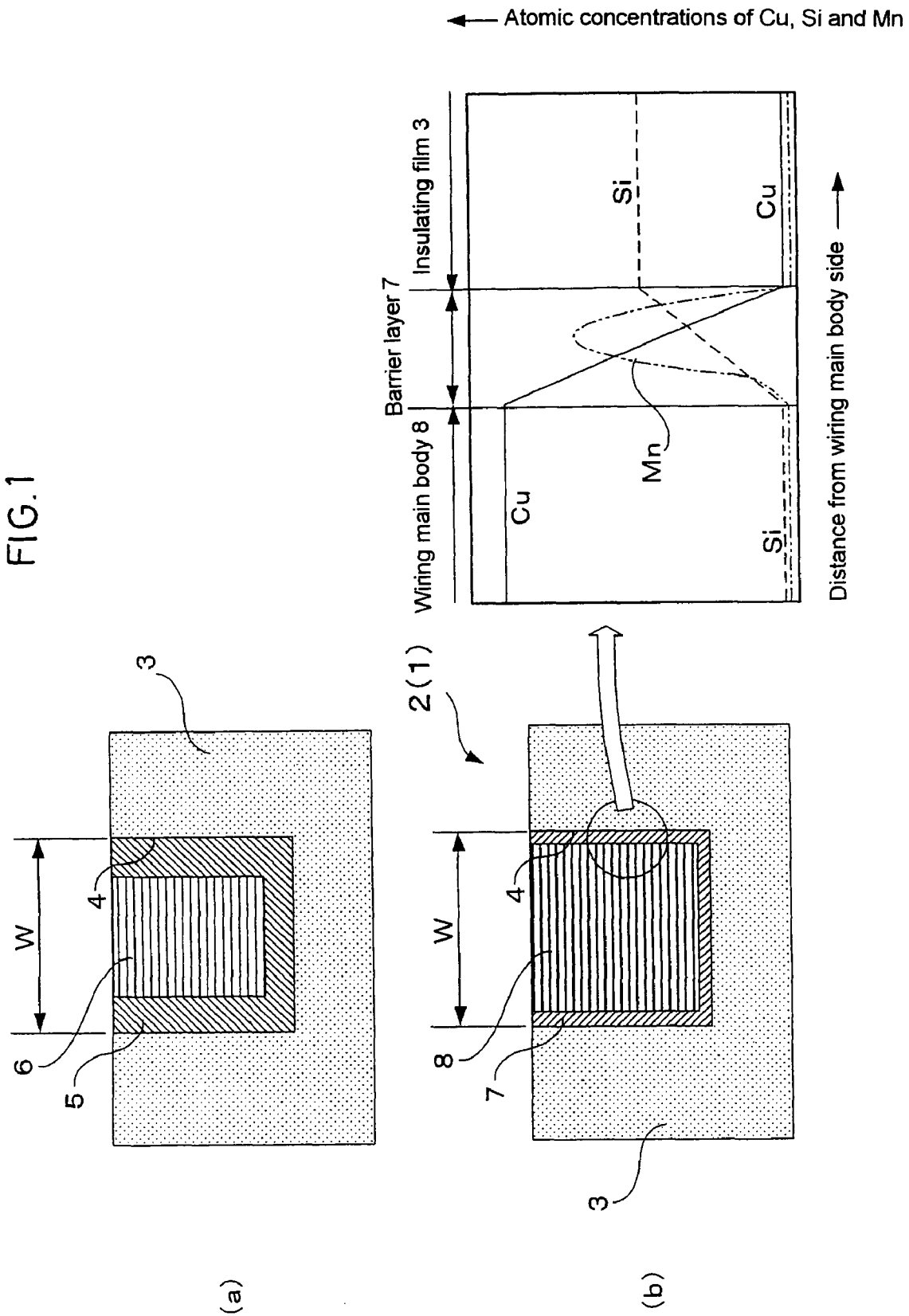
FIG. 1 is an explanatory view schematically illustrating the procedure of fabrication and the configuration of the semiconductor device of this invention.

FIG. 1 is an explanatory diagram schematically illustrating the procedure of fabrication and the configuration of the semiconductor device of this invention, (a) depicting the former half of the procedure of fabrication and (b) the latter half of the procedure of fabrication. A wiring 2 disposed in a semiconductor device 1 of this invention is composed, as illustrated in FIG. 1(b), of an insulating film 3 containing silicon (Si), a wiring main body 8 formed of copper (Cu) (the mark in the parentheses denoting an atomic symbol) in an opening 4 disposed in the insulating film and shaped like a groove, and a barrier layer 7 formed between the wiring main body 8 and the insulating film 3.

Then, this barrier layer 7, as illustrated in the right side of FIG. 1(b), is constructed as an Mn-based oxide coating having the atomic concentration of manganese (Mn) maximized in the central part in the direction of thickness. The barrier layer 7 contains Cu in the inner part thereof and the atomic concentration of Cu monotonously decreases from the side of the wiring main body 8 toward the insulating film 3 side opposite the wiring main body. Further, a divarent or trivalent ionized Mn exists on the side of the wiring main body 8 contiguous to the barrier layer 7.

The fabrication of this semiconductor device 1, as illustrated in FIG. 1(a), comprises first forming an opening 4 of the shape of a groove in the Si-containing insulating film 3, then forming a copper alloy film (Cu alloy film) 5 containing manganese (Mn) and copper (Cu) on the inner peripheral surface of the opening 4, and subsequently embedding Cu in the opening 4 having formed the Cu alloy film 5, thereby forming a Cu-embedded layer 6. Then, by performing a heat treatment, it is rendered possible to have the Cu alloy film 5 integrated with the Cu of the Cu-embedded layer 6 and converted into the wiring main body 8 and as well have the barrier layer 7 (FIG. 1(b)) formed between the Cu alloy film 5 and the insulating film 3, with the result that the semiconductor device 1 of this invention provided with the wiring 2 will be completed.

Incidentally, the heat treatment may be performed after the Cu alloy film 5 and the Cu-embedded layer 6 are formed as described above or at the stage of forming the Cu alloy film 5 prior to embedding the Cu. When the heat treatment is performed at the stage of forming the Cu alloy film 5 prior to embedding the Cu, the surface side of the Cu alloy film 5 is converted by the heat treatment into a surface layer having Cu as a main component. When Cu is embedded in this surface layer, the surface layer and the embedded Cu integrally form the wiring main body.

The wiring configuration of this invention that is configured based on the Cu alloy film 5 may be formed on the insulating film having a flat surface. It can be utilized, in conjunction with a wiring groove (opening 4) opened for the sake of providing the insulating film 3 with a wiring or a hole perforated for the sake of enabling wirings to be mutually continued or connected, particularly effectively for forming a damascene type wiring. Now, the individual regions involved herein will be described sequentially.

(Insulating film 3) The insulating film 3 is a silicon dioxide ($SiO_2$) film containing Si and oxygen (O), a silicon oxide nitride (SiON) film, a silicon oxide fluoride (SiOF) film or a silicon oxide carbide (SiOC) film disposed on a silicon (Si) substrate, for example. This insulating film 3 may be formed as an insulating film in a multilayer wiring, namely as an interlayer insulation film.

The insulating film 3 may be formed of a multilayer film having films of different materials stacked. For example, the multilayer film may be composed of a silicon nitride (SiN) film and an $SiO_2$ film. When the insulating film formed of a multilayer film is used, the surface layer of the insulating film 3 that contacts the Cu alloy film 5 is preferred to be a film containing Si and oxygen (O) as described above.

(Cu alloy film 5) The alloy elements contained in the Cu alloy film 5 used for coating the surface of the insulating film 3 are preferred to be such elements that possess larger diffusion coefficients in Cu than the Cu's own diffusion coefficient and allow large negative free energy for the formation of oxides. The elements of this description include manganese (Mn), zinc (Zn), germanium (Ge), strontium (St), silver (Ag), cadmium (Cd), tin (Sn), indium (In), barium (Ba), praseodymium (Pr) and neodymium (Nd), for example. These elements readily form oxides in the barrier layer 7 in combination with the oxygen of the insulating film 3 or the oxygen gas contained in a minute amount during the course of the heat treatment, impart to the barrier layer 7 an excellent barriering property against the diffusion of Cu from the wiring main body 8 side and enable the insulating film 3 to excel in the insulating property. They also impart to the barrier layer 7 an excellent barriering property against the diffusion of Si from the insulating film 3 side and enable the wiring main body 8 to acquire lowered resistance. As the Cu alloy film 5 that befits this invention, a Cu—Mn alloy film may be cited, for example.

The content of the element that forms an alloy with the Cu in the Cu alloy film 5 is preferred to be not less than 0.5% and not more than 20% in terms of atomic concentration. The Cu—Mn alloy film 5 containing Mn (Cu alloy film 5), for example, in this range of atomic concentration can be obtained by sputtering a target material formed of a Cu—Mn alloy containing Mn at an atomic concentration of 7%, for example.

The Cu alloy film 5 can be formed on the insulating film made of $SiO_2$, for example, by the high-frequency sputtering process. Further, it can be formed by physical deposition processes, such as the ion plating process and the laser ablation process. It can be also formed by an ordinary chemical vapor deposition (CVD) process. Irrespectively of the type of means to be adopted for this formation, the proper temperature for forming the Cu alloy film 5 on the insulating film 3 is not more than 100° C., preferably not more than 80° C. If the Cu alloy film 5 is formed at a high temperature exceeding 100° C., the excess will be at a disadvantage in suffering the oxidation reaction due to the contact with the underlying insulating film 3 to advance unduly conspicuously during the course of the formation of the film and consequently inducing difficulty in controlling the layer thickness during the formation of the barrier layer 7 in a small thickness.

The formation of the film at a low temperature, though serving to interfere with the advance of unwanted oxidation of the Cu alloy film (Cu—Mn alloy film, for example), proves unfavorable because the difference in thermal expansion coefficient between the insulating film 3 and the Cu alloy film 5 eventually induces separation of the Cu alloy film 5 from the insulating film 3. For the purpose of avoiding the unwanted oxidation of the Cu alloy film 5 and preventing the separation thereof from the insulation film 3 as well, the temperature is preferred to be not less than −50° C. and not more than +100° C., and more preferably not less than −20° C. and not more than +80° C.

The speed of coating the insulating film 3 with the Cu alloy film (Cu—Mn alloy film, for example) (the speed of depositing the film and the speed of growing the film) is preferred to be not less than 2 nanometers (unit: nm) per minute and not more than 300 nm per minute. The Cu alloy film 5 formed at a high speed exceeding 300 nm per minute turns out to be a film destitute of continuity because the internal texture thereof becomes disordered and generates voids copiously. The Cu alloy film 5 containing voids and lacking continuity entails a disadvantage in eventually failing to impart to the Cu alloy film 5 excellent adhesiveness with the insulating film 3 because the diffusion of Mn does not occur homogeneously and the presence of voids results in decreasing the area of contact of the insulating film 3 with the Cu alloy film 5.

On the other hand, the Cu alloy film 5 formed at a low speed falling short of 2 nm per minute is fated to necessitate a heat treatment at a higher temperature for a longer time for the purpose of enabling the Mn contained in the Cu alloy film 5 to be dispersed toward the insulating film 3 side, though the inner texture is enabled to form a compact film. The barrier layer 7 formed in consequence of the heat treatment gains in thickness and eventually hinders the formation of a barrier film 7 of a small thickness in the wiring groove 4 having a small opening width.

The proper speed of forming the Cu alloy film (Cu—Mn alloy film, for example) 5 on the insulating film 3, therefore, is not less than 2 nm per minute and not more than 300 nm per minute. By implementing the deposition at a speed in this range, it is rendered possible to obtain the Cu alloy film that contains virtually no void in the joint part with the insulating film 3 or inside the Cu alloy film 5. The Cu alloy film 5 possessing excellent continuity that is advantageous for stably bringing about the atomic concentration distributions of Cu and Si described more specifically herein below, therefore, can be obtained.

(Cu embedded layer 6) The formation of the Cu embedded layer 6 is accomplished by embedding Cu in the opening 4 that has formed the Cu alloy film 5 therein. For the sake of this embedding, the Cu can be deposited by various forming means, such as the electroplating, the CVD method and the high frequency sputtering method.

(Barrier layer 7) When the Cu embedded layer 6 is formed on the Cu alloy film 5 and a heat treatment is then given to the resultant stacked layers, the Cu alloy film 5 is integrated with the Cu of the Cu embedded layer 5 and consequently converted into the wiring main body 8 and as well the barrier layer 7 is formed between the Cu alloy film 5 and the insulating film 3. By this heat treatment, the Cu, the Mn that is an element for forming an alloy with Cu and the Si that is an element for forming the insulating film 3 are thermally diffused and enabled to form a barrier layer 7 containing Cu, Mn and Si.

The proper temperature for performing the heat treatment is not less than 150° C. and not more than 600° C. If the heat treatment is performed at a lower temperature than 150° C., the shortage in temperature will be at a disadvantage in allowing no sufficient advance of the diffusion of an element forming the insulating film 3, such as Si, from the insulating film 3 to the barrier layer 7 side and consequently suffering a consequence of the barrier layer 7 deficient in adhesiveness with the insulating film 3 because the Si, for example, does not mingle in the barrier layer 7 so as to be thoroughly harmonized therewith. Conversely if the heat treatment is performed at a higher temperature than 600° C., the excess of temperature will be at a disadvantage in rendering conspicuous the diffusion of Si from the insulating film 3 side toward the interior of the barrier layer 7 and consequently suffering a consequence of the barrier layer 7 deficient in the barriering property.

The heat treatment is advantageously carried out in a flow of a pure inert gas inevitably containing oxygen ($O_2$) only (such as an inert gas containing not more than 0.2 vol. ppm of oxygen, for example) or an inert gas containing 75 vol. ppm of oxygen in terms of volume concentration at most. Nitrogen gas or hydrogen gas can be used similarly to the inert gas because it is incapable of reacting Cu. The heat treatment, therefore, may be carried out in a flow of nitrogen gas or hydrogen gas inevitably containing oxygen ($O_2$) only (such as nitrogen gas or hydrogen gas containing not more than 0.2 vol. ppm of oxygen, for example) or nitrogen gas or hydrogen gas containing 75 vol. ppm of oxygen in terms of volume concentration at most.

It has been ascertained that when the heat treatment is carried out in the atmosphere of pure inert gas, nitrogen gas or hydrogen gas inevitably containing oxygen only, the resistance of the wiring main body 8 continues to decrease with the elapse of the time of the heat treatment as will be described in detail herein below. This phenomenon occurs because the alloy element contained in the Cu alloy film 5 diffuses in the interface with the insulating film 3 and forms the barrier layer 7 and the alloy element not participating in the formation of the barrier layer 7 diffuses the Cu embedded layer 6 and forms on the surface of the wiring main body 8 an oxide by the reaction with the oxygen in the atmosphere of inert gas, nitrogen gas or hydrogen gas and consequently the alloy element concentration in the Cu alloy film decreases, becomes pure Cu of the same composition as the Cu embedded layer 6 and produces an integrated wiring main body 8 of low resistance.

The heat treatment performed in the atmosphere of inert gas, nitrogen gas or hydrogen gas containing oxygen molecules in a volume ratio exceeding 75 vol. ppm is at a disadvantage in suffering the oxidation of the Cu alloy film 5 (such as a Cu—Mn alloy film, for example) and the Cu embedded layer 6 to be unfavorably promoted and consequently suffering the electric resistance of the wiring main body 8 to increase.

As examples of the inert gas, helium (He), neon (Ne), argon (Ar), krypton (Kr) and xenon (Xe) may be cited. Among the inert gases cited above, He, Ne or Ar proves to be a preferable choice. Further, in consideration of the economy of the process of heating, the inert gas for forming the atmosphere is preferred to be Ar. By using nitrogen gas or hydrogen gas instead of the inert gas, it is rendered possible to perform the heat treatment at a lower cost.

In the heat treatment, the Cu alloy film (such as Cu—Mn alloy film, for example) 5 reacts with the oxygen contained in the insulating film 3 and consequently forms the barrier layer 7 in the interface. Incidentally, the barrier layer 7 that is formed by the heat treatment performed at a prescribed temperature for a prescribed time has a decided thickness. When the Cu alloy film 5 contains Mn copiously during the initial stage of growth, therefore, the part of Mn other than is spent in forming the barrier layer 7 remains in the Cu alloy film 5 and results in raising the resistance of the wiring main body 8. It is therefore necessary that the remaining Mn be expelled to the exterior and the resistance of the wiring be decreased. To cope with this necessity, the wiring main body 8 is made to form an oxide on the surface thereof by using as the atmosphere for the heat treatment inert gas, nitrogen gas or hydrogen gas containing oxygen as an unavoidable impurity, or inert gas, nitrogen gas or hydrogen gas containing oxygen in a ratio of not more than 75 vol. ppm and enabling the excess Mn to react with the oxygen contained in the atmosphere. As a result, the Mn in the inner part of the wiring is dissipated from the inner part of the wiring main body 8 in the form of the surface oxides of the barrier layer 7 and the wiring main body 8 and the resistance of the wiring is equalized with that of pure Cu.

When the heat treatment is carried out in the state in which the insulating film 3 invariably containing oxygen, the Cu alloy film 5 and the Cu embedded layer 6 are present, the Mn in the Cu alloy film 5 reacts with the insulating film 3 and forms the barrier layer 7. The excess Mn other than is spent for forming the barrier layer 7 remains in the wiring unless the ensuing oxygen atmosphere is duly adjusted. For the purpose of extracting the Mn, the atmosphere of inert gas, nitrogen gas or hydrogen gas necessitates a trace of oxygen. When the amount of oxygen is proper, the Cu of the wiring main body 8 will not be oxidized because the Mn is extracted from the wiring main body 8 and the Mn oxide is formed on the surface of the wiring main body 8. If the amount of oxygen is unduly large, however, the resistance of the wiring will be increased because not only Mn is oxidized but also Cu of the wiring main body 8 is oxidized.

By subjecting the Cu alloy film (such as Cu—Mn alloy film, for example) 5 and the Cu embedded layer 6 containing virtually no void and formed at the favorable depositing speed on the Si-containing insulating film 3 to the heat treatment performed in the advantageous atmosphere of inert gas, nitrogen gas or hydrogen gas in the aforementioned temperature range, it is rendered possible to distribute the Cu forming the Cu alloy film 5 so as to be monotonously decreased inside the barrier layer 7 toward the insulating film 3 side.

Further, by subjecting the Cu alloy film (such as Cu—Mn alloy film, for example) 5 and the Cu embedded layer 6 containing virtually no void and formed at the favorable depositing speed on the Si-containing insulating film 3 to the heat treatment performed in the advantageous atmosphere of inert gas, nitrogen gas or hydrogen gas in the aforementioned temperature range, it is rendered possible to distribute the Si forming the insulating film 3 inside the barrier layer 7 so as to be monotonously decreased toward the Cu alloy film 5 side.

Furthermore, by subjecting the Cu alloy film (such as Cu—Mn alloy film, for example) 5 and the Cu embedded layer 6 containing virtually no void and formed at the favorable depositing speed on the Si-containing insulating film 3 to the heat treatment performed in the advantageous atmosphere of inert gas, nitrogen gas or hydrogen gas in the aforementioned temperature range, it is rendered possible to distribute the Mn atoms in the barrier layer 7 collectively in the region having the atomic concentrations of both Si and Cu approximately equal so as to have the largest atomic concentration in the barrier layer 7. The expression "approximately equal atomic concentrations" as used in this invention refers to the fact that the atomic concentrations of Cu and Si are equal or the fact that the atomic concentration of Si falls in the range of +20% relative to the atomic concentration of Cu.

The expression "collective distribution of Mn atoms" refers to the state having Mn locally distributed as illustrated on the right side of FIG. 1(b). The distribution of the atomic concentration of an element can be investigated by the electron energy-loss spectroscopy (EELS) using an ordinary field emission transmission electron microscope.

Incidentally, the Mn is distributed so as to possess the largest atomic concentration in the barrier layer 7 for the following reason. Specifically, since the oxide forming energy of Mn is lower than that of Cu and higher than that of Si, the Mn diffuses to the interface, reacts with the oxygen in $SiO_2$, and forms an oxide. At this time, since Mn characteristically forms a composite oxide containing Cu and Si, it assumes the form of Mn oxide incorporating Cu on the wiring main body 8 side near the interface (barrier layer 7) and the form of Mn oxide incorporating Si on the other insulating layer 3 side. Since these Mn oxides prevent the diffusion of Cu from the wiring main body 8 side and prevent the diffusion of Si from the insulating layer 3 side, the region in which the Mn oxides incorporate Cu and Si is eventually limited and, as a result, the concentrations of Cu and Si are decreased and the concentration of Mn is maximized in the central part of the interface layer (barrier layer 7).

It is inferred that the occurrence of a balanced electric field in the region in the barrier layer 7 having the atomic concentrations of Cu and Si approximately equal due to the balance of the concentrations of Cu atoms and Si atoms may be one cause for concentrated distribution of the Mn atoms in that region. In any event, the concentrated distribution of Mn in this specific region in the barrier layer 7 can be obtained as a result of using the Cu alloy film 5 that permits uniform occurrence of the diffusion of Mn atoms owing to the deposition at the favorable speed of deposition and the consequent substantial absence of voids.

The Mn atoms distributed in a concentrated manner in the region in the barrier layer 7 having the atomic concentrations of Cu and Si approximately equal possess an effect of preventing simultaneously the further diffusion of Cu from the wiring main body 8 side toward the insulating film 3 side and the further diffusion of Si from the insulating film 3 toward the wiring main body 8 side. They are furthermore capable of bringing about an effect of suppressing simultaneously the degradation of the electric insulating property of the insulating film 3 due to the penetration into the insulating film 3 of the Cu diffused from the wiring main body 8 and the impartation of high resistance to the wiring main body 8 due to the diffusion into the wiring main body 8 of the Si forming the insulating film 3.

Now, the thickness of the barrier layer 7 will be described below. As the ratio of the thickness of the barrier layer 7 to the horizontal width (opening width) W of the wiring groove 4 increases, the increase proportionately adds to the disadvantage incurred in forming the wiring main body 8 of low resistance. As the thickness of the barrier layer 7 formed in the wiring groove 4 of certain opening width increases, the volume of the wiring main body 8 decreases and the resistance of the wiring main body 8 increases proportionately.

In this invention, therefore, the thickness of the barrier layer 7 containing Cu, Mn and Si is specified to be not less than 1 nm and not more than ⅕ of the opening width W (refer to FIG. 1) of the wiring groove 4 formed in the insulating film 3 and as well the thickness of the barrier layer 7 to be not more than 10 nm at most. If the barrier layer 7 is an extremely thin film having a thickness falling short of 1 nm, this shortage will in the first place pose a problem of keeping the layer from becoming a barrier layer capable of sufficiently preventing the diffusion of Cu and Si. Conversely, if the thickness of the barrier layer increases beyond ⅕ of the opening width W of the wiring groove 4 or if it exceeds 10 nm though not exceeding ⅕ (such as when the thickness of the barrier layer 7 is 15 nm (⅙) while the opening width W is 90 nm, for example), since the barrier layer 7 has too large a thickness to allow formation of the wiring main body 8 having a large width (large volume), the excess will entail a disadvantage in rendering difficult the formation of the wiring main body 8 of low resistance such as, for example, the wiring main body 8 formed of Cu having such a small specific resistance of about 2 µΩcm as equals that of pure Cu.

The thickness of the barrier layer 7 conforming to this invention is preferred to decrease in accordance as the opening width W of the wiring groove 4 is narrowed for the purpose of enabling the produced wiring main body 8 to acquire low resistance. In the wiring groove 4 having an opening width W of 90 nm±5 nm, for example, the barrier layer 7 having a thickness of 5 nm to 10 nm is formed. Then, in the wiring groove 4 having an opening width W of 65 nm±3 nm, the barrier layer 7 having a thickness of 7 nm±3 nm is formed. Then, in the wiring groove 4 having an opening width W of 45 nm±2 nm, the barrier layer 7 having a thickness of 5 nm±2 nm is formed. Further, in the wiring groove having an opening width W of 32 nm±2 nm, the barrier layer 7 having a thickness of 3.5 nm±1 nm is formed.

When the barrier layer 7 containing Cu, Mn and Si and having a thickness befitting the opening width W of the wiring groove 4 is formed by the heat treatment of the Cu—Mn alloy film 5 during the formation of the wiring of the Damascene structure that is provided with the barrier layer 7, the barrier layer 7 of the thickness mentioned above is formed by performing the heat treatment for a time (t:t>0) that is decided by the logarithm-containing relation as shown by the following formula (1).

Mathematical Formula 1:

$$x(\text{nm}) = k \cdot \log(t) + C \quad (1)$$

In the formula, x denotes the expected thickness (unit: nm) of the barrier layer 7, k the proportionality constant relating to the time of heat treatment, t the time of heat treatment (unit: hour) and C the constant (unit: nm) relating to the temperature of heat treatment (unit: ° C.)

To cite, for example, the case of performing the heat treatment at 450° C. in the atmosphere of argon (Ar) containing oxygen ($O_2$) at a volume concentration of 50 vol. ppm, the relation between x (nm) and t (hour) (t>0) is found by the following formula (2), providing that x=0 when t=0.

Mathematical Formula 2:

$$x(\text{nm}) = 1.2 \cdot \log(t) + 5.0 \quad (2)$$

To cite, for example, the case of performing the heat treatment at 350° C. in the same environment as mentioned above, the relation between x (nm) and t (hour) (t>0) is expressed by the following formula (3), providing that x=0 when t=0.

Mathematical Formula 3:

$$x(\text{nm})=0.3\cdot\log(t)+3.1 \tag{3}$$

The proportionality constant k and the constant C shown in Formula (1), when the heat treatment is performed in the same environment, assume smaller values than any other as shown in Formulae (2) and (3) in accordance as the temperature of the heat treatment is lowered. No matter what temperature may be used for the heat treatment, this temperature is preferred to decrease in proportion as the thickness in which the barrier layer 7 is formed decreases. When the heat treatment is performed at a fixed temperature, the time of the heat treatment is preferred to increase for the purpose of enabling the produced barrier layer 7 to acquire as large a thickness as permissible.

For the purpose of obtaining the barrier layer 7 having a thickness of 5 nm by the heat treatment at 450° C., for example, this temperature is retained over a period of one hour. Then, for the purpose of obtaining the barrier layer 7 having a thickness of 3 nm by the heat treatment at 350° C., for example, this temperature is retained over a period of one hour. Then, for the purpose of obtaining the barrier layer 7 having a thickness of 2 nm by the heat treatment at 250° C., for example, this temperature is retained over a period of three hours.

The term "time of heat treatment" as used in this invention refers to the interval from the time the temperature reaches the level for performing the heat treatment till the time the cooling is started. The time of heat treatment at the temperature of heat treatment in the preferred range mentioned above is generally preferred to be 60 minutes or more than that. Even in the heat treatment lasting over a long time, such as 100 hours or 200 hours, the thickness of the barrier layer 7 to be formed increases in proportion as the aforementioned value of logarithm of the time of heat treatment increases. In consideration of the economy of the process of heat treatment, however, the time of heat treatment is preferred to be 10 hours at most.

Next, the amorphous barrier layer 7 will be described. Since the barrier layer 7 is amorphous, i.e. devoid of grain boundaries serving as preferential routes for ready mutual diffusion of the component atoms of the insulating film 3 and the wiring main body 8 disposed on the opposite sides thereof, it proves advantageous for the sake of securing the barrier property.

The proper temperature of heat treatment during the formation of the barrier layer is not less than 150° C. and not more than 600° C. as described above. When the barrier layer 7 is given an amorphous form, the temperature of heat treatment is preferred to be not less than 150° C. and not more than 450° C.

In the case of the heat treatment at a lower temperature than 150° C., since the Si of the insulating film 3 does not mingle in the barrier layer 7 so as to be thoroughly harmonized therewith, the security of the adhesiveness with the insulating film 3 is attained only with difficulty and the thermal diffusion of the Mn, for example, of the Cu alloy film 5 toward the insulating film 3 is attained insufficiently. As a result, this heat treatment is at a disadvantage in failing to stably form the barrier layer that is endowed sufficiently with the barriering function.

When the heat treatment is performed at a higher temperature exceeding 450° C., the barrier layer 7 possessing a polycrystalline texture and containing grain boundaries copiously is obtained as a result, though the thermal diffusion of the Mn, for example, in the Cu alloy film 5 toward the insulating film 3 is promoted. As a result, this heat treatment likewise proves to be disadvantageous because atomic diffusion is generated via grain boundaries to induce loss of the barrier property against diffusion and the element diffused and mingled in the insulating layer entails leakage of the device operating current in the insulating film that is expected to enable mutual isolation of the adjacent wirings.

When the temperature of heat treatment is in the range of not less than 150° C. and not more than 450° C., the Mn of the Cu alloy film 5 migrates to the interface between the Cu alloy film 5 and the insulating film 3 and as well enables formation of the amorphous barrier layer 7. At this time, the ionized Mn begins to exist as described above on the wiring main body 8 side contiguous to the barrier layer 7 and electric fields are formed on either side of the barrier layer 7 that is in the process of being formed. In consequence of the acceleration of the diffusion of the Mn ions in the barrier layer 7 by these electric fields, the speed of the growth of the barrier layer 7 becomes proportionate to the logarithm of time. As a result, the thickness of the barrier layer 7 suddenly increases during the initial stage of formation and the speed of change of the thickness is slowed with the elapse of time. Even in the heat treatment at a comparatively low temperature of 150° C., therefore, the amorphous barrier layer can be stably formed and, owning to the amorphousness, the barrier layer 7 consequently obtained is enabled to excel in the diffusion barrier property and the electric insulating property. Even when the heat treatment is performed at a high temperature, such as 450° C., for a long time, such as 100 hours, the amorphous barrier layer 7 can be stably formed and the diffusion barrier property and the electric insulating property can be maintained.

When the barrier layer 7 is formed as described above, the Mn ionized to divalency or trivalency begins to exist on the wiring main body 8 side contiguous to the barrier layer 7. As a result, a positive electric charge exists on the wiring main body 8 side contiguous to the barrier layer 7, an electric field is formed between the barrier layer 7 and the insulating film 3 side opposed thereto, and the wiring main body 8 and the insulating film 3 are attracted to the barrier layer 7 by the electric fields formed on either side of the barrier layer 7. Even from this point of view, it is enabled to bring about the effect of enhancing the adhesiveness of the interface.

By performing the deposition at a comparatively high speed within the favorable range of deposition speed (2 nm/min to 300 nm/min) contemplated by this invention and thereafter performing the heat treatment at a comparatively low temperature within the favorable range of temperature (150° C. to 450° C.) contemplated by this invention, it is rendered possible to form the barrier layer 7 having an amorphous texture. It is further rendered possible to form the barrier layer 7 that has Mn atoms centralized at a high concentration of not less than twice the atomic concentration of Cu or Si in the region of the inner part of the amorphous barrier layer 7 having the Cu atoms diffused from the Cu alloy film 5 approximately equal the concentration of the Si atom contained in the insulating film 3.

The amorphous barrier layer 7 having the atomic concentrations of Cu, Si and Mn in the aforementioned relation is stably produced by depositing the Cu alloy film 5 at a depositing speed of not less than 7 nm and not more than 300 nm per minute on the insulating film 3, forming the Cu embedded layer 6 on the Cu—Mn alloy film 5 and thereafter heating the Cu—Mn alloy film 5 and the Cu embedded layer 6 in an atmosphere formed of pure inert gas, nitrogen gas or hydrogen gas and containing oxygen inevitably or in an atmosphere formed of inert gas, nitrogen gas or hydrogen gas and containing oxygen at a ratio of 75 vol. ppm at most at a temperature of not less than 150° C. and not more than 450° C.

By causing the region in the amorphous barrier layer, which region has the concentrations of the Cu atoms and the Si atoms approximately equal, to allow the centralized presence of Mn at a concentration exceeding the concentrations mentioned above, the diffusion of Cu and Si can be suppressed more effectively owing to the action manifested by the oxide having Mn as a main component toward preventing the diffusion of Cu and Si. Then, by causing centralized distribution in the same region of the Mn atoms having a concentration of not less than twice the concentration of the Cu atoms or the Si atoms, the diffusion of Cu and Si can be prevented more thoroughly.

By the deposition at such a high speed as described above and the heat treatment at a comparatively low temperature, the amorphous barrier layer having no grain boundary can be stably formed and the anomalous diffusion of Cu and Si via the grain boundary can be prevented. The question whether the barrier layer 7 is in the amorphous form or not can be determined by the electron diffraction pattern.

While the foregoing description has assumed the heat treatment to be performed after the Cu embedded layer 6 has been formed on the Cu alloy film 5, the heat treatment may be performed after the formation of the Cu alloy film 5. Alternatively, the heat treatment may be carried out after the Cu embedded layer 6 has been embedded in the wiring groove 4 and then the surface of the Cu embedded layer 6 has been subsequently flattened by the CMP (chemical mechanical polishing).

While the foregoing description has assumed that the barrier layer 7 is formed based on the Cu alloy film 5 that is formed by the method of sputtering a target material, the barrier layer 7 of the construction contemplated by this invention can also be formed based on a multilayered film that is configured by first depositing a Mn film on the insulating film 3 containing Si and then depositing a Cu film on the Mn film. It can be alternatively formed based on a multilayered film configured by first depositing a Cu film on the insulating film 3 containing Si and then depositing an Mn film on the Cu film. Then, the barrier layer is obtained by forming the Cu embedded layer 6 on the multilayered film and subjecting them to the heat treatment and the barrier layer is obtained by subjecting the multilayered film to the heat treatment prior to forming the Cu embedded layer 6. When the speeds of deposition of the Cu film and the Mn film are made to fall in the favorable range similarly to the case of the Cu alloy film 5 irrespectively of the sequence of stacking of the component films, the result is at an advantage in allowing production of the Mn film and the Cu film that contain voids scarcely.

(Wiring main body 8) When the Cu alloy film 5 deposited at a speed found favorable by this invention and containing virtually no void is formed, further the Cu embedded layer 6 is formed by embedding Cu in the wiring groove 4 continuous to the Cu alloy film 5 by the ordinary high-frequency sputtering method, and thereafter they are subjected to the heat treatment, the wiring main body 8 is enabled to acquire wiring resistance approximately equaling that of pure Cu and the produced wiring main body 8 is enabled to acquire low resistance.

In the first embodiment, as described above, since the barrier layer 7 formed of an oxide containing Cu, Si and Mn is formed between the wiring main body 8 and the insulating film 3 and since this barrier layer 7 has the atomic concentration of Cu monotonously decreasing from the wiring main body 3 side toward the insulating film 3 side, the atomic concentration of Si monotonously decreasing from the insulating film 3 toward the wiring main body 8 side and the atomic concentration of Mn maximize in the region in which the atomic concentrations of Cu and Si become approximately equal, the barrier layer 7 becomes the layer of a thermally stable and structurally compact oxide. The barrier layer 7, therefore, assumes a structure effective for the sake of suppressing the diffusion, acquires an excellent barriering property against the diffusion of Cu from the wiring main body 8 side and enables the insulating film 3 to excel further in the insulating property. It eventually acquires an excellent barriering property against the diffusion of Si from the insulating film 3 side and enables the wiring main body 8 to exhibit still lower resistance. The semiconductor device, by thus being provided with the wiring that exhibits low resistance and possesses the ability to prevent leakage of the operating current of the device, merits more lowered electric power consumption.

Further, since the barrier layer 7 has the atomic concentration of Cu therein monotonously decrease from the side of the wiring main body 8 having Cu as a main component toward the insulating film 3 side, it enables enhancement of the adhesiveness thereof with the Cu film constituting the wiring main body 8 and allows the semiconductor device to excel in the reliability of operation over a long time because the atomic concentration distribution does not change abruptly between the barrier layer 7 and the wiring main body 8 having Cu as a main component and the concentration of Cu is continuously varied.

Further, the barrier layer 7 has the boundary face thereof with the insulating film 3 consist of an oxide mainly containing Si and Mn in consequence of the diffusion and the atomic concentration of Si in the barrier layer 7 monotonously decrease from the insulating film 3 toward the wiring main body 8 side. Thus, the Si composition distribution from the insulating film 3 describes a continuous pattern instead of a precipitous and discontinuous pattern in the boundary face with the barrier layer 7. The interfacial strength between the insulating film 3 and the barrier layer 7 can be increased and the adhesiveness with the insulating film 3 can be enhanced. Even from this point of view, the semiconductor device is enabled to excel in the reliability of the operation over a long time.

Thus, the present invention can realize lowering the electric power consumption of the semiconductor device by lowering the resistance of the wiring main body 8 and enhancing the insulating property of the insulating film 3 and as well enables the semiconductor device to excel in the reliability of operation over a long time by enhancing the adhesiveness between the barrier layer 7 and the wiring main body 8 and enhancing the adhesiveness between the barrier layer 7 and the insulating film 3.

Then, the present invention causes the atomic concentration of Mn in the region, in which the atomic concentrations of Cu and Si are approximately equal, to become not less than twice as high as the atomic concentration of Cu or Si. The barrier layer 7, therefore, becomes an oxide having Mn as a main component and the growth of this barrier layer 7 conforms to the law of logarithms of the time in contrast to the oxide that has Cu or Si as a main component and consequently continues to grow continuously. This conformity to the law of logarithms may be possibly described by the following supposition. Since the oxide of the barrier layer 7 having Mn as a main component possesses a compact structure and generates slow diffusion, the growth of this oxide is not induced by the ordinary thermal diffusion. The free electrons accompanying the Mn atoms are tunnel-transferred to the side opposite the barrier layer 7 (the insulating film 3 side) to bring about the presence of the ionized Mn on the wiring main body 8 side contiguous to the barrier layer 7, with the result that electric fields will be formed on either side of the barrier layer 7 in the process of formation. The acceleration of the diffusion of Mn ions in the barrier layer 7 that is caused by the electric fields initiates the growth of the oxide having Mn as a main component. Owing to this behavior of growth, the speed of the growth of the barrier layer 7 is made to conform to the law of logarithms. As a result, the thickness of the barrier layer rapidly increases during the initial stage of the formation of the barrier layer 7, the speed of change of the thickness is slowed with the elapse of time, and the growth is suppressed and prevented from exceeding several nm. The barrier layer 7, therefore, becomes a coating formed of a thermally stable and structurally compact Mn oxide and constitutes a structure effective for the sake of suppressing the diffusion. As a result, the barrier property of the barrier layer 7 against the diffusion of Cu from the wiring main body 8 side and the diffusion of Si from the insulating film 3 side can be further enhanced and the insulating property of the insulating film 3 and the capacity of the wiring to lower resistance can be further enhanced.

Then, the present invention can ensure the barrier property of the barrier layer 7 against the diffusion of Cu from the wiring main body 8 side and the diffusion of Si from the insulating film 3 side because it enables the barrier layer 7 to secure a thickness of not less than 1 nm or not more than $\frac{1}{5}$ of the groove width of the opening. At the same time, it can infallibly prevent such harmful effects as causing the wiring main body 8 to be narrowed by the barrier layer 7 and consequently adding to the effective electric resistance of the wiring because the thickness of the barrier layer 7 is set to be 10 nm at most. It, therefore, enables the insulating film 3 to acquire the insulating property and the wiring to acquire the capacity to lower resistance with greater infallibility.

The present invention can suppress the anomalous diffusion of Cu and Si via the grain boundary because it has the barrier layer 7 formed in an amorphous state. It, therefore, can enhance the barrier property of the barrier layer 7 and can infallibly retain the insulating property of the insulating film 3 and the capacity of the wiring to lower resistance.

Then, the present invention allows the presence of a positive electric charge on the wiring main body 8 side adjoining the barrier layer 7 and enables formation of electric fields between the wiring main body and the insulating film 3 side opposite thereto across the barrier layer 7 because of the presence of Mg ionized to a divalent or trivalent on the wiring main body 8 side adjoining the barrier layer 7. Since the electric fields formed on either side of the barrier layer 7 attract the wiring main body 8 and the insulating film 3 toward the barrier layer 7, the effect of enhancing the adhesiveness of the grain boundary can be attained and the semiconductor device can be rendered excellent in the reliability of operation over a long time.

Then, the present invention allows the alloy elements, such as Mn, that have shunned the formation of the barrier layer 7 and have diffused and migrated as far as the surface of the wiring main body 8 to be oxidized with a minute amount of oxygen contained properly in the inert gas, nitrogen gas or hydrogen gas and dissipated from the interior of the wiring main body in the form of the surface oxide of the wiring main body 8 because the heat treatment is carried out in a pure inert gas, nitrogen gas or hydrogen gas inevitably containing oxygen or in an inert gas, nitrogen gas or hydrogen gas containing oxygen at a ratio of 75 vol. ppm at most. As a result, the resistance of the wiring approximately equals that of pure Cu and the wiring main body 8 having low resistance can be obtained.

The present invention can bring about such various effects as lowering the resistance of the wiring main body 8, enhancing the insulating property of the insulating film 3 and enhancing the adhesiveness of the wiring main body 8 and the insulating film 3, because it contemplates performing the heat treatment at a temperature of not less than 150° C. and not more than 600° C. and imparting to the barrier layer 7 a structure peculiar to this invention.

The present invention can stably form the barrier layer 7 in an amorphous state because it contemplates performing the heat treatment at a temperature of not less than 150° C. and not more than 450° C.

According to this invention, the wiring that is provided with the wiring main body 8 of low resistance and the insulating film 3 excelling in insulating property can be effectively utilized as a wiring for constructing various semiconductor devices.

The barrier layer 7 having the atomic concentrations of Cu, Mn and Si distributed as disclosed by this invention can function satisfactorily as a barrier layer in spite of small thickness unlike the conventional technique that necessitates the formation of a thick barrier layer from a Ta-based material. Thus, it can be utilized for constructing a wiring for a silicon LSI that requires the width of wiring to be decreased to not more than 90 nm, for example, for enabling high-density integration.

Then, since the wiring contemplated by this invention is provided with the wiring main body 8 of low resistance and as well the barrier layer 7 capable of preventing diffusion of Cu and Si so as to favor the prevention of the leakage of the device operating current, it can be utilized for constructing a wiring for a power device made of silicon or silicon germanium (SiGe) mixed crystal required to allow the flow of a large device operating current.

The wiring structure contemplated by this invention is provided with the barrier layer 7 capable of avoiding the leakage of the device operating current and, therefore, can be advantageously utilized for constructing an electronic device of low electric power consumption. For example, it can be utilized for constructing a wiring for electronic display devices, such as a flat display panel (FDP), organic electroluminescence (EL) device and inorganic EL device, and photovoltaic cells, such as a solar cell.

EXAMPLES

Prior to specifically describing the first embodiment of this invention, Example 1 will be described by way of a simple configuration for forming a flat Cu—Mn alloy film on a flat insulating film. The choice of the flat simple configuration was intended to enable more accurate determination of the electric resistivity of the formed Cu layer.

Example 1

Figure 2:
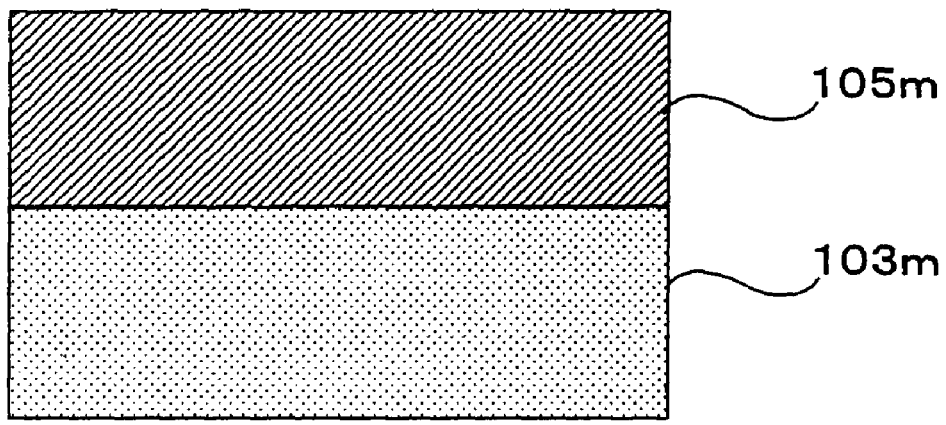
FIG. 2 is a cross section illustrating the state of stacking prior to the heat treatment in Example 1.
Figure 3:
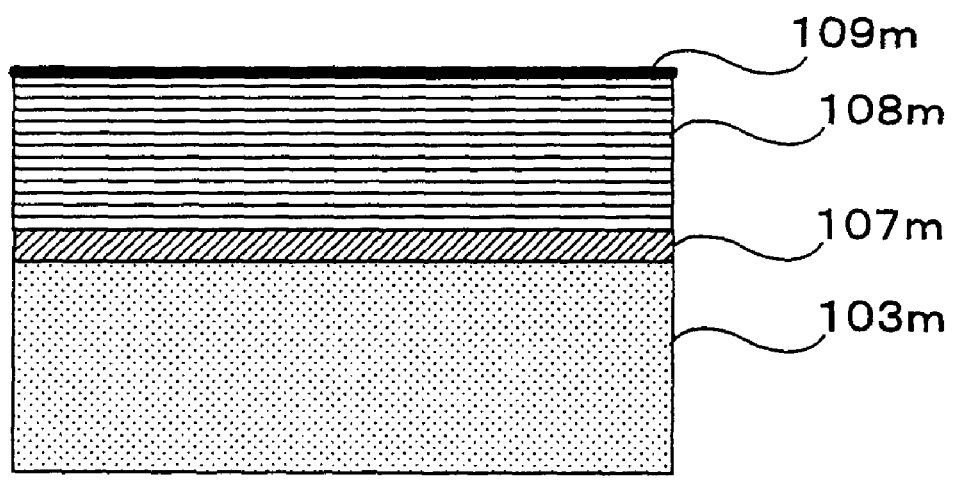
FIG. 3 is a cross section illustrating the state of stacking subsequent to the heat treatment in Example 1.

FIG. 2 is a cross section illustrating the state of stacking prior to a heat treatment in Example 1 and FIG. 3 is a cross section illustrating the state of stacking subsequent to the heat treatment in Example 1.

Referring to FIG. 2, when a Cu—Mn alloy film 105m was formed on an insulating film 103m made of $SiO_2$ and the stacked films were subjected to a heat treatment, the Mn atoms contained in the Cu—Mn alloy film 105*m* were thermally diffused toward the interface with the insulating film 103*m* and allowed to form a barrier layer 107*m* in the region near the interface as illustrated in FIG. 3. By the heat treatment, the Mn atoms were diffused and extracted toward the surface layer side of the Cu—Mn alloy film 105*m*, the Cu—Mn alloy film 105*m* was transformed into a Cu layer 108*m* occupied wholly by Cu, and an Mn oxide film 109*m* was formed on the surface layer of the Cu layer 108*m*. This Cu layer 108*m* that corresponded to the wiring main body 8 involved in the first embodiment was formed of substantially pure Cu. Here, the Cu—Mn alloy film 105*m* was composed of 96% of Cu and 4% of Mn in terms of atomic concentration ratio and formed in a thickness of 150 nm. In consequence of the subsequent heat treatment, the barrier layer 107*m* acquired a thickness of 3 nm and the Mn oxide film 109*m* a thickness of 14 nm.

The heat treatment used an atmosphere of argon (Ar) gas, i.e. an inert gas. The samples of the Cu layer 108*m* obtained by performing the heat treatment at 350° C. in the atmosphere having the volume content of oxygen in the argon gas varied were found to have varying magnitudes of specific resistance as shown in FIG. 4.

Figure 4:
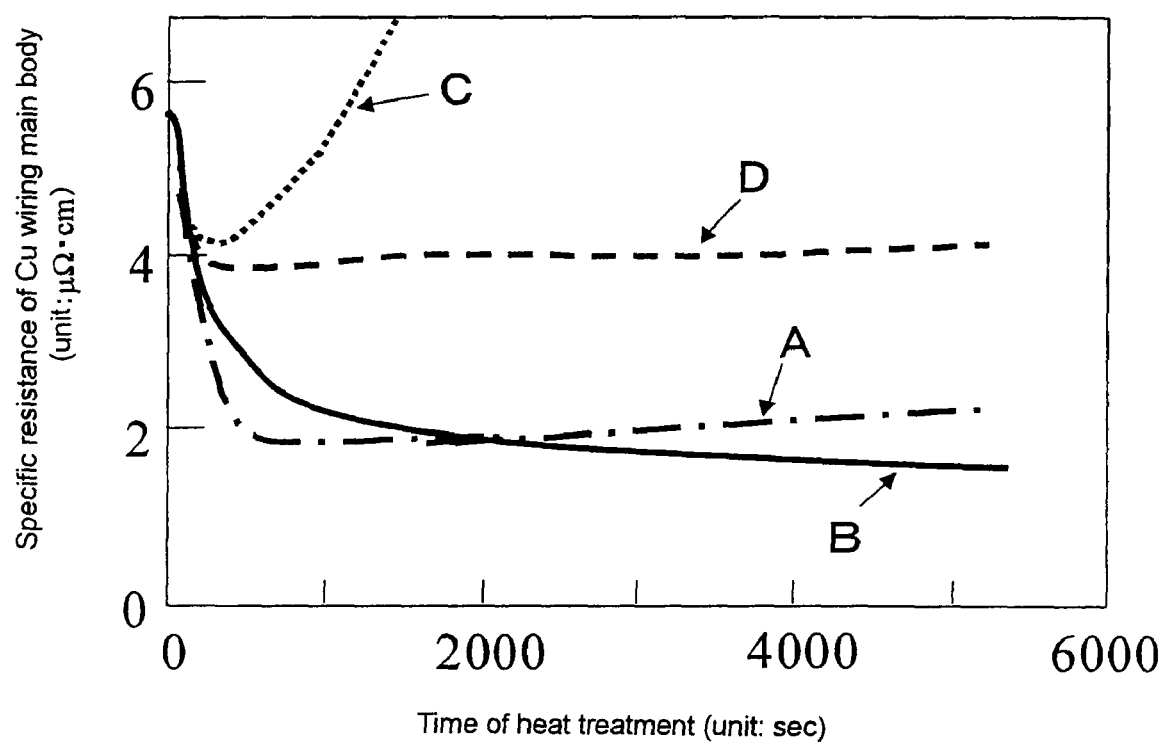
FIG. 4 is a view illustrating the dependency of the specific resistance of the wiring main body on the environment of the heat treatment and the time of the heat treatment.

In FIG. 4, the abscissa axis is the scale of the time of heat treatment (unit: second) and the ordinate axis the scale of the specific resistance (unit: $\mu\Omega$cm). The curves represent the magnitudes of specific resistance shown by the samples of the Cu layer 108 formed by the heat treatment performed under varying gas atmosphere conditions A to D. Of the gas atmosphere conditions A to D, A denotes an argon gas atmosphere containing oxygen at a volume content of 50 ppm, B an argon gas atmosphere of high purity, C an argon gas atmosphere containing oxygen at a volume content of 1000 ppm and D a vacuum (here, $5\times10^{-7}$ Torr). The argon gas atmosphere of high purity denoted by B inevitably contained oxygen in a volume content of 0 to 0.2 ppm as shown in Table 1 below. Of the product standards G1, G2 and G3, G2 was used herein.

TABLE 1

| | Product standards of high-purity argon gas | | |
|---|---|---|---|
| | G1 | G2 | G3 |
| Purity | >99.999 vol. % | >99.995 vol. % | >99.999 vol. % |
| Impurity $N_2$ | <0.3 vol. ppm | <0.5 vol. ppm | — |
| $O_2$ | <0.1 vol. ppm | <0.2 vol. ppm | <0.2 vol. ppm |
| $H_2$ | <0.1 vol. ppm | <0.5 vol. ppm | <1.0 vol. ppm |
| CO | <0.1 vol. ppm | <0.2 vol. ppm | — |
| $CO_2$ | <0.1 vol. ppm | <0.2 vol. ppm | <1.0 vol. ppm |
| THC | <0.1 vol. ppm | <0.2 vol. ppm | <1.0 vol. ppm |
| $H_2O$ | <−80° C. | <080° C. | <−70° C. |

FIG. 4 clearly shows that the heat treatment performed in an argon gas atmosphere containing oxygen in a volume concentration of 50 vol. ppm (gas environment condition A) enabled the formation of the barrier layer 107*m* possessing atomic concentration distributions of Cu, Mn and Si conforming to this invention and as well that the specific resistance of the Cu layer 108*m* rapidly decreased in several minutes and reached a small magnitude of about 2.0 to 2.2 J$\Omega$·cm in about 30 minutes, i.e. a level nearly equal to that of pure Cu (the electric resistivity of a thin film made of pure Cu: 1.9 to 2.0 $\mu\Omega$cm).

When the heat treatment was performed in a high-purity argon gas atmosphere (gas atmosphere condition B), the specific resistance of the Cu layer 108*m* continued to decrease rather slowly as compared with the case of the heat treatment in the gas atmosphere condition A, reached 2.0 $\mu\Omega$cm in about 30 minutes, continuously decreased with the elapse of time subsequent to the crossing of the condition with the gas atmosphere condition A, and decreased to about 1.9 $\mu\Omega$cm in about 90 minutes, i.e. a level nearly equal to that of the thin film formed of pure Cu.

The big decrease of the specific resistance of the Cu layer 108*m* in the gas environment condition A may be logically explained by a supposition that the Mn present in the Cu—Mn alloy film 105*m* was diffused to the surface of the Cu layer 108*m*, allowed to form the Mn oxide film 109*m*, and expelled from within the Cu layer 108*m*. Then, the big decrease of the specific resistance of the Cu layer 108*m* in the gas atmosphere condition B may be logically explained by a supposition that because of extremely low oxygen concentration in the atmosphere, the Cu layer 108*m*, while expelling the Mn, could further suppress the oxidation induced in the Cu layer 108*m* by the largeness of the amount of oxygen in the condition A.

Meantime, in the argon gas atmosphere containing oxygen at a volume content of 1000 ppm (the gas atmosphere condition C), the specific resistance of the Cu layer 108*m* decreased during the initial stage of the reaction treatment but increased thereafter because of vigorous surface oxidation. In the vacuum (the gas atmosphere condition D), while the specific resistance of the Cu layer 108*m* decreased during the initial stage of the heat treatment similarly to the condition C, it did not subsequently decrease but approximately leveled off or moderately increased because of the influence of the slow surface oxidation in the vacuum.

It has been ascertained that when the Cu—Mn alloy film 105*m* was subjected to the heat treatment conforming to this invention, the Cu layer 108*m* formed from the Cu—Mn alloy film 105*m* was ultimately formed of pure Cu and the electric resistivity thereof approximately equaled that of pure Cu.

Now, more specific contents of the first embodiment of this invention will be described below. The detailed description will be made by citing, for example, the case of forming the wiring groove 4 on the insulating film 3 containing Si and wiring structure provided with the wiring main body 8 having low resistance and made of Cu and the barrier layer 7 containing Cu, Mn and Si based on the Cu—Mn alloy film 8 formed in the wiring groove 4.

Example 2

Figure 5:
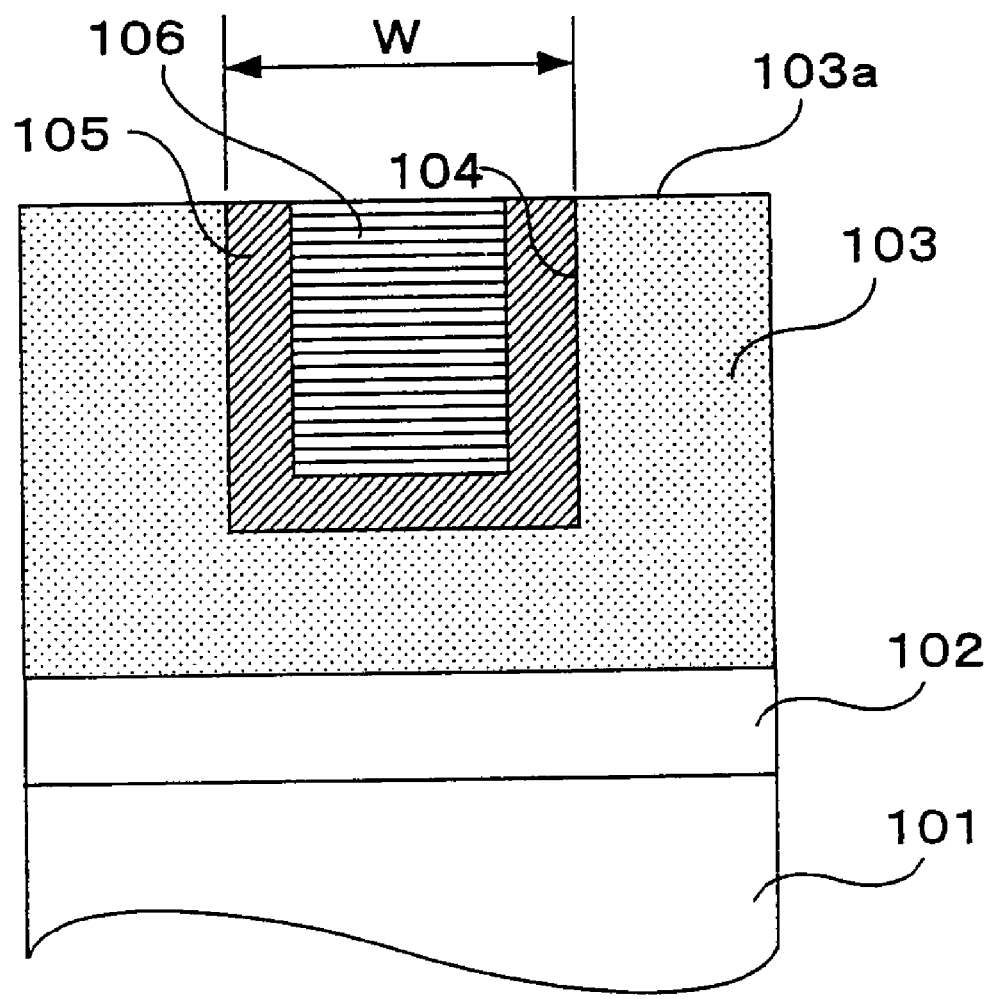
FIG. 5 is a schematic cross section of the semiconductor device prior to the heat treatment described in Example 2 in the first embodiment of this invention.
Figure 6:
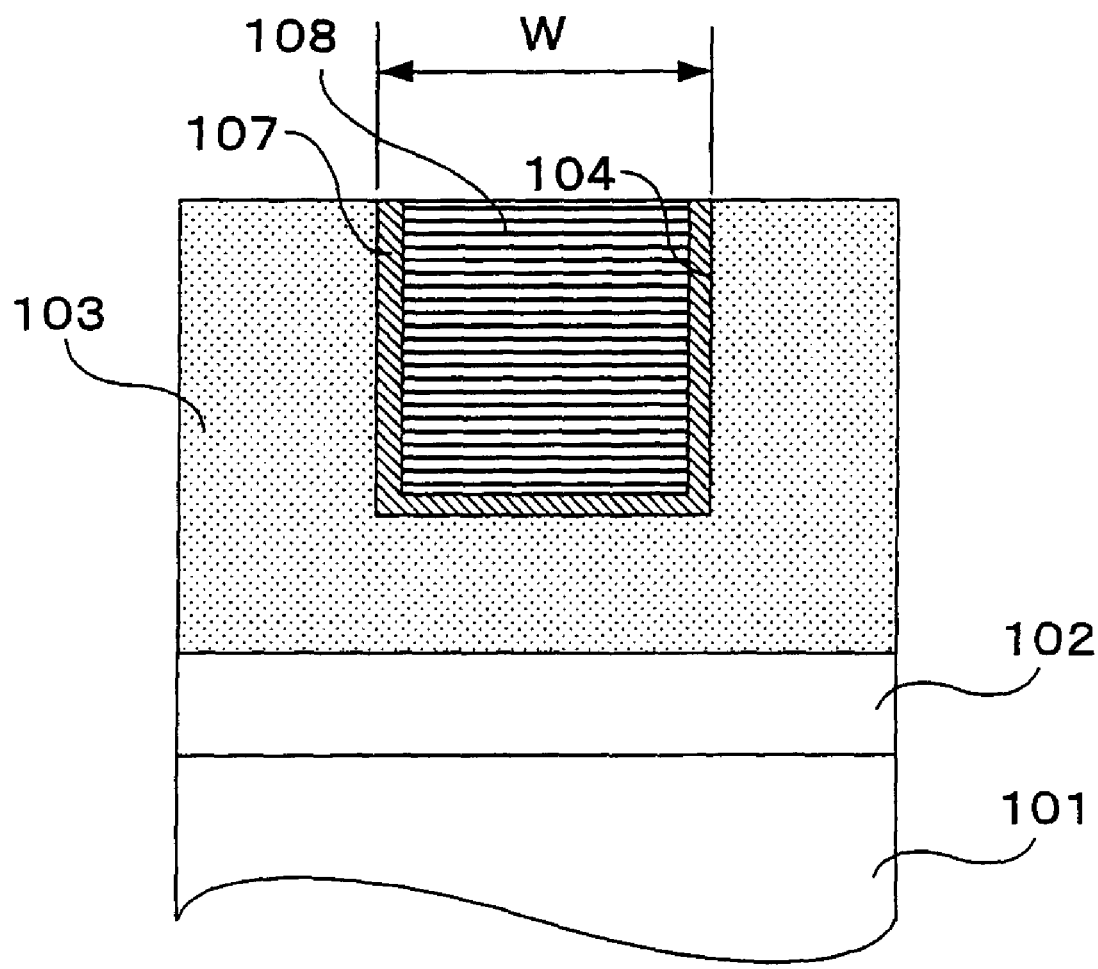
FIG. 6 is a schematic cross section of the semiconductor device subsequent to the heat treatment described in Example 2 in the first embodiment of this invention.
Figure 7:
FIG. 7 is a cross-sectional photograph of the barrier layer in the semiconductor device described in Example 2 in the first embodiment of this invention.

FIG. 5 schematically illustrates the cross-sectional structure of the interior of the wiring groove in the state resulting from depositing the Cu—Mn alloy film on the insulating film and then depositing the Cu embedded layer thereon. FIG. 6 schematically illustrates the cross-sectional structure of the interior of the wiring groove in the state resulting from subjecting the Cu—Mn alloy film in the wiring groove and the Cu embedded layer to the heat treatment. FIG. 7 is a transmission electron micrograph illustrating the cross-sectional structure of the barrier layer formed by the heat treatment.

As illustrated schematically in FIG. 5, on the surface of an electroconductive silicon semiconductor layer 102 formed on a silicon substrate 101, a $SiO_2$ layer of a thickness of 150 nm was deposited by the ordinary chemical vapor deposition method as an insulating film 103. Next, part of the insulating film 103 was removed by etching in accordance with the ordinary photolithographic technique to form a wiring groove (opening) 104. The wiring groove 104 had an opening width (lateral width) W of 90 nm.

Then, a Cu—Mn alloy film 105 was deposited on the surface of the insulating film 103 and the lateral faces and the bottom face of the interior of the wiring groove 104. The Cu—Mn alloy film 105 was formed by the ordinary high-frequency sputtering method using a target material formed of a Cu—Mn alloy containing Mn at an atomic concentration of 7%. The Cu—Mn alloy film 105 was formed while the temperature of the silicon substrate 101 was kept at 50° C. The depositing speed of the Cu—Mn alloy film 105 on the surface of the insulating film 103 was fixed at 12 nm per minute. The ratio of the atomic concentration of Mn in the Cu—Mn alloy film 105 was determined by the EELS method to be 5%. The thickness of the Cu—Mn alloy film 105 was such as to measure 80 nm on the flat surface 103a of the insulating film 103 that had avoided forming the wiring groove 104. By this time, the Cu—Mn alloy film of about 20 nm had been formed on the bottom of the wiring groove 104.

Next, the surface of the Cu—Mn alloy film 105 was plated with Cu by the ordinary electrolytic plating method (not shown in FIG. 5). The Cu plating was deposited in a thickness large enough to fill up the interior of the wiring groove 104. Then, the ordinary CMP means was used to polish and remove the plated Cu layer and the Cu—Mn alloy film 105 till the flat surface 103a of the insulating film 103 was exposed. As a result, the Cu—Mn alloy film 10 was allowed to remain only inside the wiring groove 104 and the Cu deposited by plating on that surface was made to remain as a Cu embedded layer 106.

Next, the Cu—Mn alloy film 105 retained inside the wiring groove 104 and the Cu embedded layer 106 were subjected to the heat treatment performed in an argon (Ar) atmosphere containing oxygen at a volume ratio of 50 vol. ppm at a temperature of 300° C. for 30 minutes. As a result, the Cu—Mn alloy 105 thermally diffused the Mn atoms contained therein toward the interface with the insulating film 103. Consequently, a barrier layer 107 was formed in a region near the interface. The formed barrier layer 107 had a thickness of 5 nm. In consequence of this heat treatment, the surface layer part of the Cu—Mn alloy film 105 that allowed expulsion of the Mn by diffusion and that was eventually occupied substantially wholly by Cu and the Cu embedded layer 106 were integrated to give rise to the wiring main body 108 formed of Cu. The transmission electron micrograph of the barrier layer 107 formed by this heat treatment is shown in FIG. 7.

The barrier layer 107 was analyzed by the electron energy-loss spectroscopy (EELS) to determine the concentration distribution of Cu, Mn and Si. This EELS analysis was performed with a field-emission transmission electron microscope (TEM) of high resolution, with the field scanned with electron beams spaced 0.2 nm apart. The result of this analysis showed that the concentration of Cu atoms decreased monotonously from the wiring main body 108 toward the $SiO_2$ insulating film 103. It was also shown that the concentration of Si atoms decreased monotonously from the $SiO_2$ insulating film 103 toward the wiring main body 108.

In the TEM observation, voids were scarcely recognized in the barrier layer 107. Owing to the uniform occurrence of diffusion of the Mn atoms, the Mn atoms were concentrically accumulated in the region in which the concentrations of Cu atoms and Si atoms are approximately equal. Then, the concentration of the accumulated Mn atoms was maximized in the region in which the concentrations of the Cu atoms and the Si atoms of the barrier layer 107 occupy approximately the same amount.

Further, in consequence of the heat treatment mentioned above, the surface layer part of the Cu—Mn alloy film 105 that allowed expulsion of the Mn by diffusion and that was eventually occupied substantially wholly by Cu and the Cu embedded layer 106 were integrated to give rise to the wiring main body 108 formed of Cu and as well the Mn oxide film was formed on the surface layer part of the wiring main body 108 (not shown in FIG. 6). The oxide film in the upper surface layer part was removed by the CMP means. Consequently, the surface of the Cu wiring main body 108 was exposed and the Cu wiring main body 108 was tested for electric resistivity. The electric resistivity of the Cu wiring main body 108 was extremely low and reached 2.5 µΩcm, i.e. a level approximately equal to that of the wiring formed by embedding pure Cu in the wiring groove having an opening width of 90 nm.

Thus, according to Example 2 of this invention, the barrier layer 107 effective for suppressing diffusion allowed the production of the Cu wiring exhibiting as low resistance as the wiring formed of pure Cu. Further, the barrier layer 107 enabled the insulating film 103 to gain an enhanced insulating property, the produced wiring to exhibit low resistance and acquire an ability to prevent leakage of the device operating current, and consequently the produced semiconductor device to have the benefit of low power consumption. Owing to the enhanced adhesiveness between the barrier layer 107 and the wiring main body 108 and the enhanced adhesiveness between the barrier layer 107 and the insulating film 103, the semiconductor device was enabled to excel in the reliability of operation for a long time.

Example 3

The contents of this invention will be described below citing, for example, the case of forming a wiring structure by using an amorphous barrier layer containing Cu, Mn and Si.

On the surface of the insulating film formed as described in Example 2 above and the lateral faces and the bottom face of the interior of the wiring groove having an opening width of 90 nm, a Cu (atomic concentration ratio=93%)—Mn (atomic concentration ratio=7%)—based alloy film was deposited by the ordinary high-frequency sputtering method. For the purpose of infallibly forming the amorphous barrier layer, the speed of depositing the Cu—Mn alloy film on the $SiO_2$ insulating film was set at 10 nm per minute.

Then, on the Cu—Mn alloy film, Cu was deposited by the ordinary plating method as described in Example 2 above. Subsequently, the Cu—Mn alloy film and the Cu plated layer were polished and removed by the ordinary CMP method in such a manner that the Cu—Mn alloy film and the Cu embedded layer might be allowed to remain only inside the wiring groove as described in Example 2 above.

Thereafter, the Cu—Mn alloy film was heat-treated at 200° C. for the purpose of forming an amorphous barrier layer devoid of a grain boundary capable of inducing normal diffusion of Mn. The atmosphere used for the heat treatment was an argon (Ar) atmosphere containing oxygen at a volume ratio of 50 vol. ppm similarly to the case of Example 2 above.

The time of heat treatment was fixed at 4 hours. Consequently, the barrier layer having a thickness of 3 nm was formed.

It was demonstrated that the electron diffraction image acquired by utilizing the ordinary TEM was a halo and that the barrier layer obtained was in an amorphous form.

Figure 8:
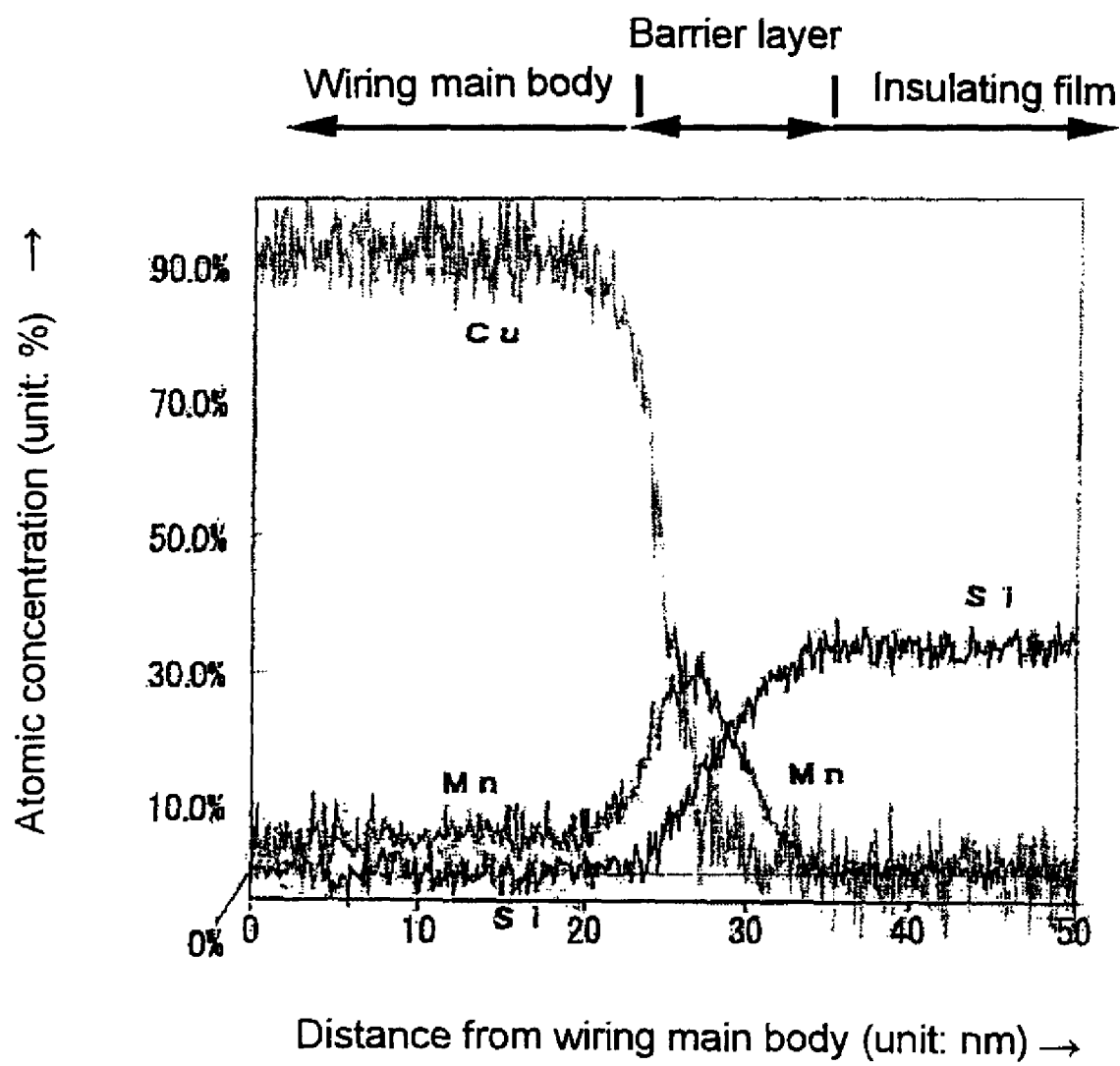
FIG. 8 is a diagram illustrating the concentration distributions of the individual elements in the amorphous barrier layer described in Example 3 in the first embodiment of this invention.

FIG. 8 illustrates the result of analysis obtained by the electron energy-loss spectroscopy (EELS) regarding the distribution of elements in the amorphous barrier. In the elementary analysis by the EELS, the electron concentration of Cu was observed to decrease monotonously from the wiring main body (Cu—Mn alloy film) side toward the $SiO_2$ insulating film side. The atomic concentration of Si was observed to be similarly decreased monotonously from the $SiO_2$ insulating film side toward the wiring main body (Cu—Mn alloy film) side.

Then, similarly to the barrier layer described in Example 2 above, the Mn atoms were concentrically accumulated in the region in which the concentrations of the Cu atoms and the Si atoms occupy approximately the same amount. Particularly as illustrated in FIG. 8, in the place in the barrier layer in which the atomic concentrations of Cu and Si were both 15 atom %, the concentration of the Mn atoms accumulated in that region reached 33 atom %, i.e. well over twice these concentrations.

The electric resistivity of the Cu wiring main body formed based on the Cu embedded layer was extremely low and reached 2.4 μΩcm, i.e. a level approximately equaling that of the wiring formed by embedding pure Cu in the wiring groove having an opening width of 90 nm.

Thus, according to Example 3 of this invention, similarly to Example 2, the amorphous barrier layer more effective for suppressing diffusion allowed the production of the Cu wiring exhibiting as low resistance as the wiring formed of pure Cu. Further, the barrier layer enabled the insulating film to gain an enhanced insulating property, the produced wiring to exhibit low resistance and acquire an ability to prevent the leakage of the device operating current, and consequently the produced semiconductor device to have the benefit of low power consumption. Owing to the enhanced adhesiveness between the barrier layer and the wiring main body and the enhanced adhesiveness between the barrier layer and the insulating film, the semiconductor device was enabled to excel in the reliability of operation for a long time.

Example 4

This invention will be described in detail below citing, for example, the case of forming the wiring structure from the multilayered film of Mn film and Cu film deposited on the Si-containing insulating film.

The insulating film of a multilayered structure was produced by first depositing an $SiO_2$ film (thickness=100 nm) on an electroconductive silicon semiconductor layer formed on a silicon substrate and then depositing an SiOF layer (thickness=80 nm) thereon.

Next, the wiring groove having an opening width of 45 nm was formed as described in Example 2 above by the ordinary photolithographic technique. Subsequently, on the surface of the multilayered insulating film and the lateral faces and bottom surface of the interior of the wiring groove having an opening width of 45 nm, a Mn film (thickness=8 nm) was deposited by the ordinary high-frequency sputtering method using a target material made of Mn of high purity (99.999%). The depositing speed of this Mn film was set at 10 nm per minute.

Then, a Cu film (thickness=9 nm) was stacked contiguously to the Mn film at a depositing speed of 10 nm per minute by the ordinary high-frequency sputtering method. Further, on the Cu film forming the multilayered film, Cu was deposited by the ordinary electrolytic plating method as described in Example 2 above. Subsequently, as described in Example 2 above, the Cu film, Mn film and Cu plated layer were polished and removed by the ordinary CMP means in such a manner that the multilayered film formed of the Cu film and the Mn film and the Cu embedded layer might be allowed to remain only inside the wiring groove.

Thereafter, the multilayered film formed of Cu film and Mn film and the Cu embedded layer were heat-treated at 350° C. The atmosphere used for this heat treatment was an argon (Ar) atmosphere containing oxygen at a volume ratio of 60 vol. ppm. The time of heat treatment was fixed at 4 hours. Consequently, the barrier layer having a thickness of 3 nm was formed.

When the barrier layer containing Cu, Mn and Si was analyzed by the EELS method with a view to determining the distribution of the component elements therein, it was confirmed that the atomic concentration of Cu decreased monotonously from the Cu—Mn alloy film toward the $SiO_2$—SiOF multilayered insulating film side. Meanwhile, the atomic concentration of Si decreased monotonously, similarly to the case of the Cu atom, from the $SiO_2$—SiOF multilayered insulating film toward the Cu—Mn alloy film side.

Then, similarly to the barrier layer described in Example 2 above, the Mn atoms were concentrically accumulated in the region approximating more toward the $SiO_2$—SiOF multilayered insulating film than toward the center in the direction of thickness of the barrier layer wherein the concentrations of the Cu atoms and the Si atoms occupy approximately the same amount.

The electric resistivity of the Cu wiring main body formed based on the Cu embedded layer was extremely low and reached 3.4 μΩcm, i.e. a level approximately equal to that of the wiring formed by embedding pure Cu in the wiring groove having an opening width of 45 nm.

Thus, according to Example 4 of this invention, similarly to Example 2, the barrier layer effective for suppressing diffusion allowed the production of the Cu wiring exhibiting as low resistance as the wiring formed of pure Cu. Further, the barrier layer enabled the insulating film to gain an enhanced insulating property, the produced wiring to exhibit low resistance and acquire an ability to prevent the leakage of the device operating current, and consequently the produced semiconductor device to have the benefit of low power consumption. Owing to the enhanced adhesiveness between the barrier layer and the wiring main body and the enhanced adhesiveness between the barrier layer and the insulating film, the semiconductor device was enabled to excel in the reliability of operation for a long time.

In Example 4, the heat treatment was performed at 350° C. for 4 hours in an argon (Ar) atmosphere containing oxygen at a volume ratio of 60 vol. ppm. The same results as in Example 4 were obtained when the heat treatment was performed at 350° C. for 4 hours in a nitrogen gas atmosphere containing oxygen at a volume ratio of 60 vol. ppm and in a hydrogen gas atmosphere containing oxygen at a volume ratio of 60 vol. ppm.

Example 5

In Example 5, the wiring structure provided with a barrier layer was formed in the same manner as in Example 2, except changing only the conditions for the heat treatment.

The heat treatment of the Cu—Mn alloy film and the Cu embedded layer was performed at 300° C. for 90 minutes in an argon atmosphere inevitably containing oxygen at a ratio of 0.1 ppm only. Consequently, the Mn atoms contained in the Cu—Mn alloy film were thermally diffused from the alloy film toward the interface thereof with the insulating film 103, with the result that the barrier layer was formed in the region near the interface. The barrier layer thus formed had a thickness of 5 nm. In consequence of the heat treatment, the surface layer part of the Cu—Mn alloy film that allowed the expulsion of the Mn by diffusion and that was eventually occupied substantially wholly by Cu and the Cu embedded layer were integrated to give rise to the wiring main body formed of Cu.

The barrier layer was analyzed by the electron energy-loss spectroscopy (EELS) to determine the distribution of the Cu, Mn and Si atoms in the layer. This EELS analysis was performed with a field-emission transmission electron microscope (TEM) of high resolution, with the field scanned with electron beams spaced 0.2 nm apart. The result of this analysis showed that the concentration of Cu atoms decreased monotonously from the wiring main body toward the $SiO_2$ insulating film. It was also shown that the concentration of Si atoms decreased monotonously from the $SiO_2$ insulating film toward the wiring main body side.

In the TEM observation, voids were scarcely recognized in the barrier layer. Owing to the uniform occurrence of diffusion of the Mn atoms, the Mn atoms were concentrically accumulated in the region in which the concentrations of Cu atoms and Si atoms are approximately concurred. Then, the concentration of the accumulated Mn atoms was maximized in the region in which the concentrations of the Cu atoms and the Si atoms of the barrier layer occupy approximately the same amount, to approximately twice the concentrations of Cu atoms and Si atoms.

When the Cu wiring main body was tested for electric resistivity, the electric resistivity was extremely low and reached 2.6 μΩ cm, i.e. a level approximately equaling that of the wiring formed by embedding pure Cu in the wiring groove having an opening width of 90 nm.

Thus, according to Example 5 of this invention, similarly to Example 2, the barrier layer effective for suppressing diffusion allowed the production of the Cu wiring exhibiting as low resistance as the wiring formed of pure Cu. Further, the barrier layer enabled the insulating film to gain an enhanced insulating property, the produced wiring to exhibit low resistance and acquire an ability to prevent the leakage of the device operating current, and consequently the produced semiconductor device to have the benefit of low power consumption. Owing to the enhanced adhesiveness between the barrier layer and the wiring main body and the enhanced adhesiveness between the barrier layer and the insulating film, the semiconductor device was enabled to excel in the reliability of operation for a long time.

In Example 5, the heat treatment was performed at 300° C. for 90 minutes in a pure argon gas atmosphere inevitably containing oxygen at a ratio of 0.1 ppm only. The same results as in Example 5 were obtained when the heat treatment was performed at 300° C. for 90 minutes in a nitrogen gas atmosphere inevitably containing oxygen at a ratio of 0.1 ppm only and in a hydrogen gas atmosphere inevitably containing oxygen at a ratio of 0.1 ppm only.

Example 6

In Example 6, the wiring structure provided with a barrier layer was formed in the same manner as in Example 2, except changing the opening width W of the wiring groove. Example 6 and Example 2 differ in the following points.

The opening width W was fixed at 32 nm and the thickness of the Cu—Mn alloy film was such as to measure 30 nm on the flat surface of the insulating film that had avoided forming the wiring groove. By this time, the Cu—Mn alloy film of about 8 nm had been formed on the bottom of the wiring groove.

Then, the heat treatment for the Cu—Mn alloy film retained in the wiring groove and the Cu embedded layer was carried out at a temperature of 350° C. over a period of 30 minutes in a pure argon atmosphere inevitably containing oxygen at a ratio of 0.1 ppm only. By this heat treatment, the Cu—Mn alloy film thermally diffused the Mn atoms contained therein toward the interface thereof with the insulating film, with the result that the barrier layer was formed in the region near the interface. The formed barrier layer had a thickness of 2 nm.

In Example 6, the barrier layer was analyzed by the electron energy-loss spectroscopy (EELS) to determine the concentration distributions of Cu, Mn and Si atoms therein. This EELS analysis was performed with a field-emission transmission electron microscope (TEM) of high resolution, with the field scanned with electron beams spaced 0.2 nm apart. The result of this analysis showed that the concentration of Cu atoms decreased monotonously from the wiring main body toward the $SiO_2$ insulating film. It was also shown that the concentration of Si atoms decreased monotonously from the $SiO_2$ insulating film toward the wiring main body.

In the TEM observation, voids were scarcely recognized in the barrier layer. Owing to the uniform occurrence of diffusion of the Mn atoms, the Mn atoms were concentrically accumulated in the region in which the concentrations of Cu atoms and Si atoms are approximately concurred. Then, the concentration of the accumulated Mn atoms was maximized in the region in which the concentrations of the Cu atoms and the Si atoms of the barrier layer occupy approximately the same amount, to about twice the concentrations of the Cu atoms and the Si atoms.

The transmission electron micrograph of the barrier layer that had undergone the heat treatment clearly shows that the barrier layer formed therein a random texture peculiar to amorphousness.

The electron energy-loss spectroscopy (EELS) spectrua of Mn were obtained from the region of the wiring main body and the region of the barrier layer. They allowed confirmation that the Mn atoms existing in the region adjoining the barrier layer of the wiring main body possessed the same valency as in the central part of the barrier layer and that they were ionized to divalency or trivalency.

When the Cu wiring main body was tested for electric resistivity, the electric resistivity was extremely low and reached 4.6 μΩcm, i.e. a level approximately equaling that of the wiring formed by embedding pure Cu in the wiring groove having an opening width of 32 nm.

Thus, according to Example 6 of this invention, similarly to Example 2, the barrier layer effective for suppressing diffusion allowed the production of the Cu wiring exhibiting as low resistance as the wiring formed of pure Cu. Further, the barrier layer enabled the insulating film to gain an enhanced insulating property, the produced wiring to exhibit low resistance and acquire an ability to prevent the leakage of the device operating current, and consequently the produced semiconductor device to have the benefit of low power consumption. Owing to the enhanced adhesiveness between the barrier layer and the wiring main body and the enhanced adhesiveness between the barrier layer and the insulating film, the semiconductor device was enabled to excel in the reliability of operation for a long time.

Further, Example 6 has demonstrated that this invention can be applied to the case of the wiring groove having a narrower opening width of 32 nm besides the case of the wiring groove having an opening width of 90 nm or 45 nm.

Now, the second embodiment of this invention and examples thereof will be described below.

Figure 9:
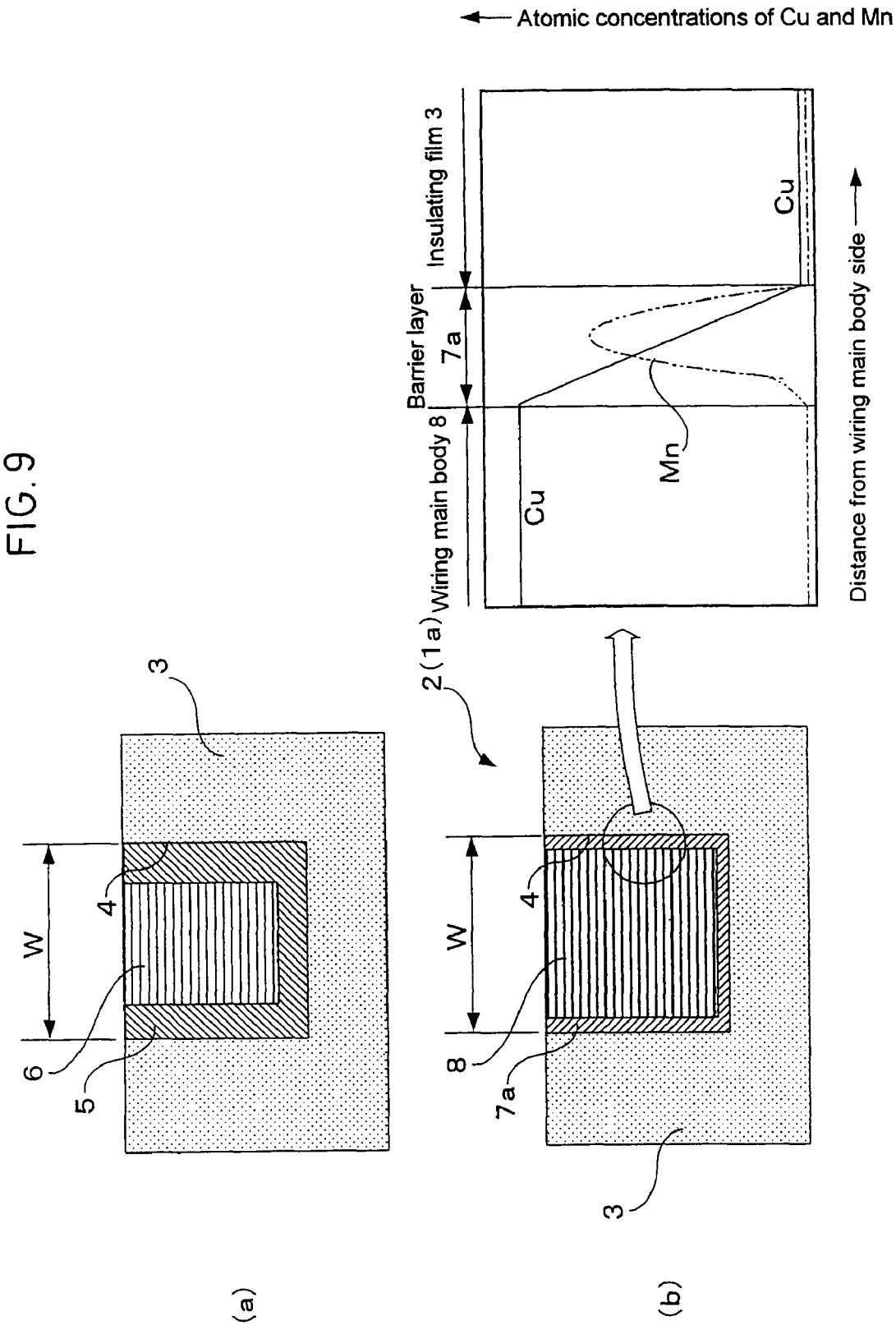
FIG. 9 is an explanatory view schematically illustrating the procedure of fabrication and the configuration of the semiconductor device in the second embodiment of this invention; (a) depicting the former half of the procedure of fabrication and (b) the latter half of the procedure of fabrication.

FIG. 9 is an explanatory diagram schematically illustrating the procedure of fabrication and the configuration of a semiconductor device in the second embodiment of this invention, (a) depicting the former half of the procedure of fabrication and (b) the latter half of the procedure of fabrication.

In the second embodiment of FIG. 9, the structural elements approximately identical with those of the first embodiment described above will be denoted by the same reference numerals and will be omitted from the description given herein. The second embodiment differs from the first embodiment in the construction of a barrier layer 7a. The barrier layer 7a, as illustrated in the right side of FIG. 9(b), is configured as an Mn-based oxide coat having the atomic concentration of Mn maximized in the central part in the direction of thickness and the barrier layer 7a contains Cu therein and the atomic concentration of the Cu decreases monotonously from the wiring main body 8 side toward the insulating film 3 side that is opposed to the wiring main body 8. In the barrier layer 7a, Si is not indicated as a constructional element.

Then, the thickness of the barrier layer 7a is specified to be not less than 1 nm and not more than ⅕ of the opening width W (refer to FIG. 9(a)) of the wiring groove 4 disposed in the insulating film 3 and not more than 10 nm as well.

In the side of the wiring main body 8 contiguous to the barrier layer 7a, the Mn ionized to divalece or trivalence exists.

Further, in the second embodiment of this invention, the heat treatment is carried out in the current of a pure inert gas inevitably containing only oxygen ($O_2$) or an inert gas containing oxygen in a volume concentration of 75 vol. ppm at most. Alternatively, it may be carried out in the current of nitrogen gas or hydrogen gas inevitably containing oxygen ($O_2$) or nitrogen gas or hydrogen gas containing oxygen in a volume concentration of 75 vol. ppm at most.

According to the second embodiment of this invention, the barrier layer 7a has a simple structure as compared with that in the first embodiment and nevertheless can manifest the following effects similarly to the first embodiment.

That is to say, a barrier layer 7a formed of an Mn-based oxide and having the atomic concentration of Mn maximized in the central part of the layer thickness, namely a barrier layer 7a formed of an Mn-based oxide and having Mn concentrated in the central part of the layer thickness, is interposed between the insulating film 3 and the wiring main body 8. This barrier layer 7a exhibits thermal stability, forms a structurally compact layer and constitutes an effective configuration for the sake of suppression of diffusion. Thus, it eventually acquires an excellent barriering property against diffusion of Cu from the wiring main body 8 side and enables the insulating film 3 to excel in the insulating property. Further, it eventually acquires an excellent barriering property against the diffusion of Si from the insulating film 3 side and enables the wiring main body 8 to exhibit low resistance. The semiconductor device 1a aimed at, therefore, is enabled to merit low electric power consumption because of the provision of the wiring that exhibits low resistance and permits prevention of the leakage of the operating current of the device.

Then, according to the second embodiment of the invention, since the barrier layer 7a is made to be a Cu-containing coating, it is enabled to enhance the adhesiveness thereof with the Cu film fated to be formed contiguously with the surface of the barrier layer 7a and destined to constitute the wiring main body 8 and permit the semiconductor device 1a to excel in the reliability of operation over a long time because the atomic concentration distribution is not broken between the barrier layer 7a and the wiring main body 8 having Cu as a main component and the concentration of Cu is continuously varied.

Then, according to the second embodiment of the invention, since the atomic concentration of Cu in the barrier layer 7a is monotonously decreased from the side of the wiring main body 8 having Cu as a main component toward the insulating film 3 side, it is enabled to further enhance the adhesiveness thereof with the Cu film constituting the main body 8 of the wiring and permit the semiconductor device 1a to excel in the reliability of operation over a long time because the atomic concentration distribution is not broken between the barrier layer 7a and the wiring main body 8 having Cu as a main component and the concentration of Cu is continuously varied.

Then, according to the second embodiment of the invention, since the atomic concentration of the Cu contained in the barrier layer 7a is made to be smaller than the atomic concentration of Mn in the central part in the direction of the thickness of the layer, the Mn oxide becomes to exhibit slow diffusion and the barrier layer 7a is eventually formed of the oxide having the Mn as its main component because the barrier layer 7a is eventually made to assume Mn as its main component element and this Mn exhibits a strong binding force with oxygen. The barrier layer 7a, therefore, exhibits an excellent barrier property against the diffusion of Cu from the wiring main body 8 side.

Then, the present invention can ensure the barrier property of the barrier layer 7a against the diffusion of Cu from the wiring main body 8 side and the diffusion of Si from the insulating film 3 side because it enables the barrier layer 7a to secure a thickness of not less than 1 nm or not more than ⅕ of the groove width of the opening. At the same time, it can infallibly prevent such harmful effects as causing the wiring main body 8 to be narrowed by the barrier layer 7a and consequently adding to the effective electric resistance of the wiring because the thickness of the barrier layer 7a is set to be 10 nm at most. It, therefore, enables the insulating film 3 to acquire the insulating property and the wiring to acquire the capacity to lower resistance with greater infallibility.

The present invention can suppress the anomalous diffusion of Cu and Si via the grain boundary because it has the barrier layer 7a formed in an amorphous state. It, therefore, can enhance the barrier property of the barrier layer 7a and can infallibly retain the insulating property of the insulating film 3 and the capacity of the wiring to lower resistance.

Then, according to the second embodiment of the invention, there exists a positive electric charge on the wiring main body 8 side adjoining the barrier layer 7a and enables the formation of electric fields between the wiring main body and the insulating film 3 side opposite thereto across the barrier layer 7a because of the presence of a divalent or trivalent ionized Mn on the wiring main body 8 side adjoining the barrier layer 7a. Since the electric fields formed on either side of the barrier layer 7a attract the wiring main body 8 and the insulating film 3 toward the barrier layer 7a, the effect of enhancing the adhesiveness of the grain boundary can be attained and the semiconductor device 1a can be rendered excellent in the reliability of operation over a long time.

Then, the second embodiment of the invention contemplates performing the heat treatment in a pure inert gas inevitably containing oxygen or in an inert gas containing oxygen in a ratio of 75 vol. ppm at most. Therefore, the alloy elements, such as Mn, that have shunned formation of the barrier layer 7a and have diffused and migrated as far as the surface of the wiring main body 8, are oxidized with a minute amount of oxygen contained properly in the inert gas, allowed to form an oxide on the surface of the wiring main body 8 and dissipated from the interior of the wiring main body 8 in the form of a surface oxide of the wiring main body 8. As a result, the resistance of the wiring approximately equals that of pure Cu and the wiring main body having low resistance body can be obtained.

The second embodiment of the invention can bring about such various effects as lowering the resistance of the wiring main body 8, enhancing the insulating property of the insulating film 3 and enhancing the adhesiveness of the wiring main body 8 and the insulating film 3, because it contemplates performing the heat treatment at a temperature of not less than 150° C. and not more than 600° C. and imparting to the barrier layer a structure peculiar to the second embodiment of this invention.

The second embodiment of the invention can stably form the barrier layer 7a in an amorphous state because it contemplates performing the heat treatment at a temperature of not less than 150° C. and not more than 450° C.

Examples

The contents of the second embodiment of this invention will be described in detail below citing, for example, the case of forming a wiring structure provided with a wiring main body 8 having low resistance and made of Cu and a barrier layer 7a containing Cu and Mn based on a Cu—Mn alloy film 5 deposited on an insulating film 3 containing Si.

Example 7

Figure 10:
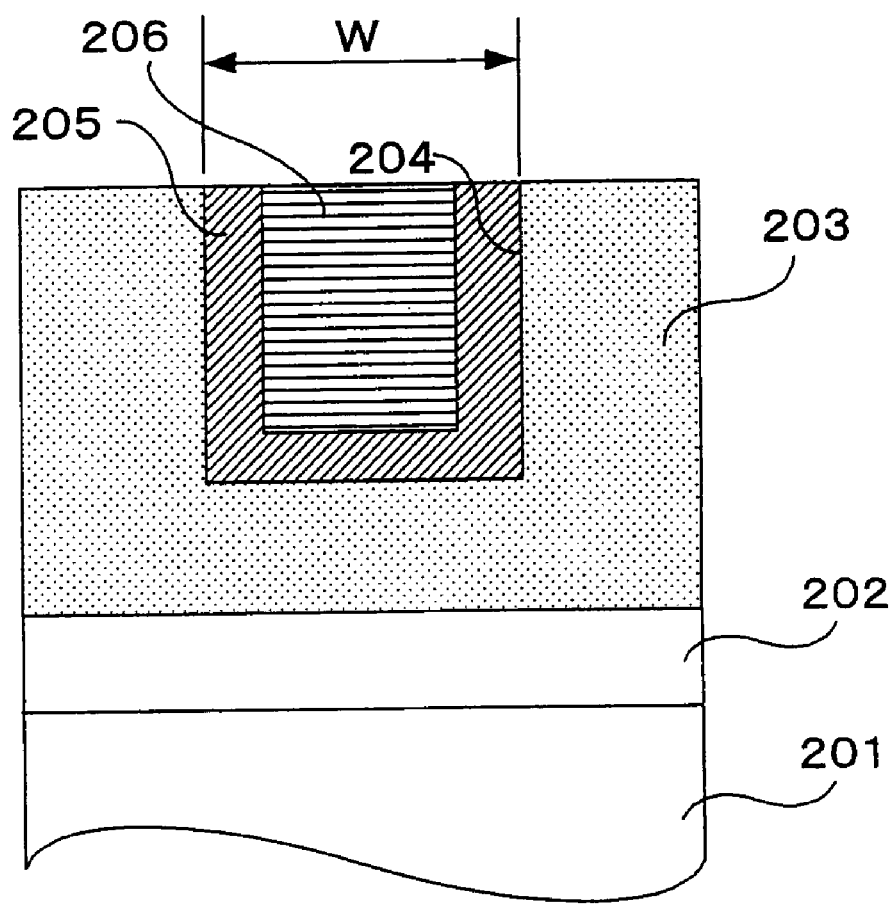
FIG. 10 is a schematic cross section illustrating the stacked structure of the film in the inner part of the wiring groove described in Example 7 in the second embodiment of this invention.
Figure 11:
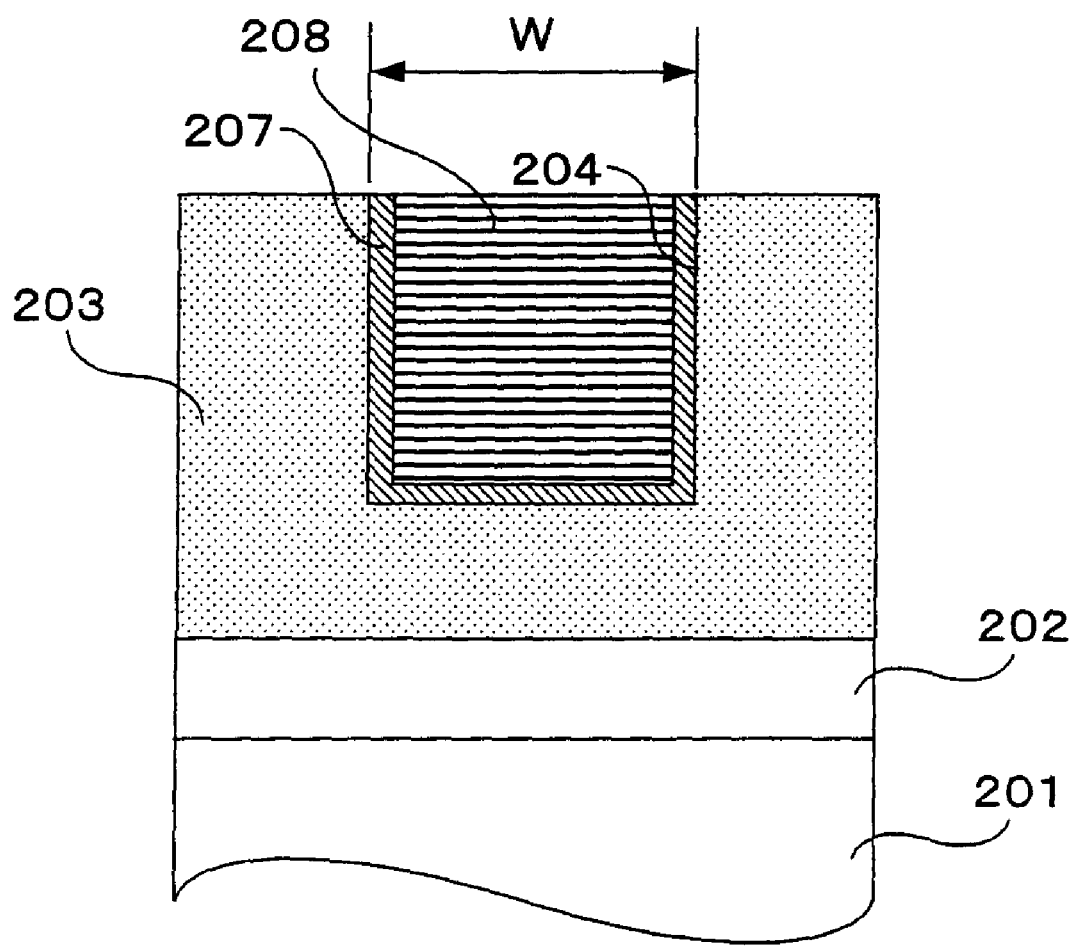
FIG. 11 is a schematic cross section illustrating the structure of the inner part of the wiring groove subsequent to the heat treatment described in Example 7 in the second embodiment of this invention.
Figure 12:
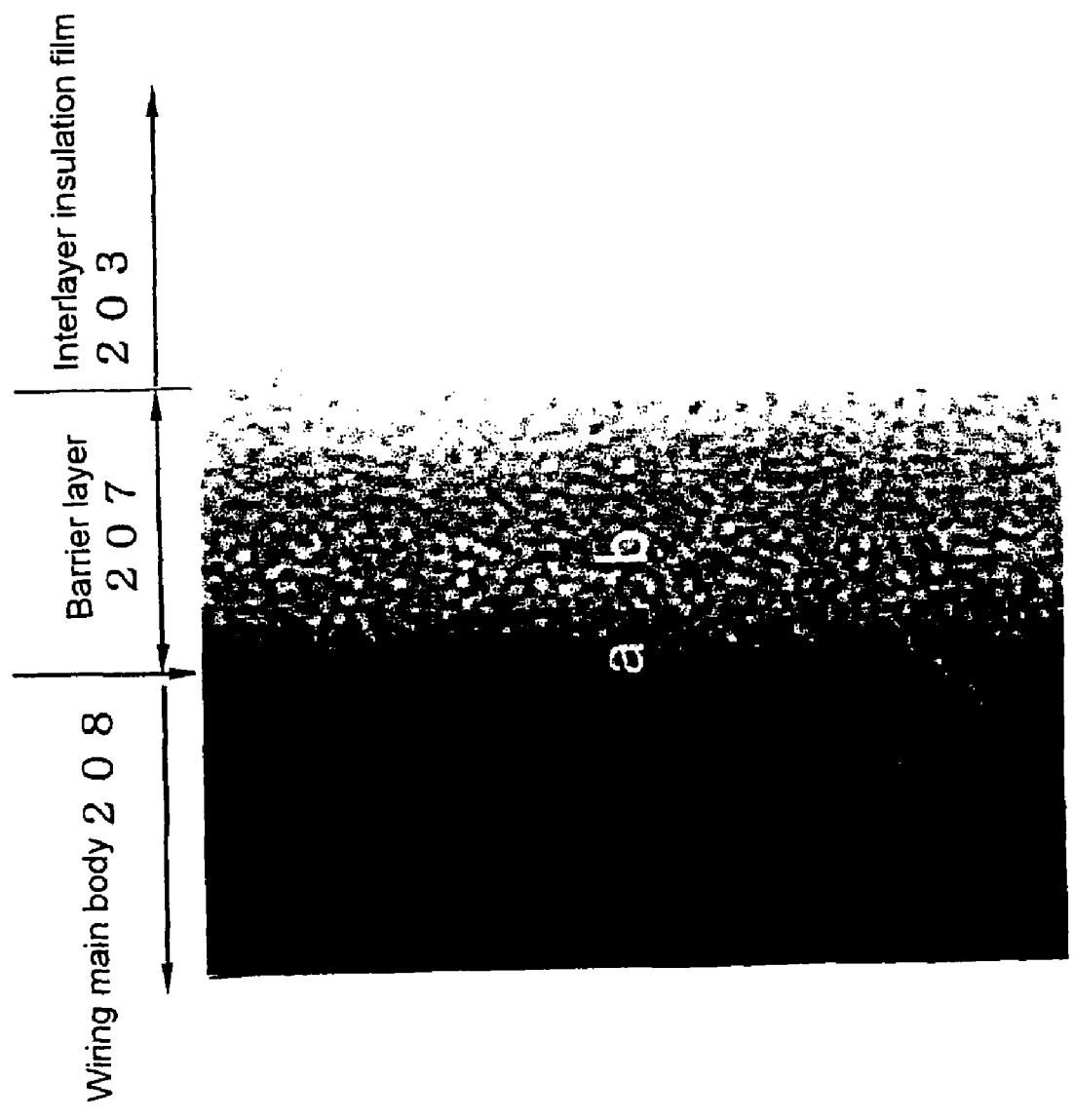
FIG. 12 is a cross-sectional electron micrograph of the barrier layer described in Example 7 in the second embodiment of this invention.
Figure 13:
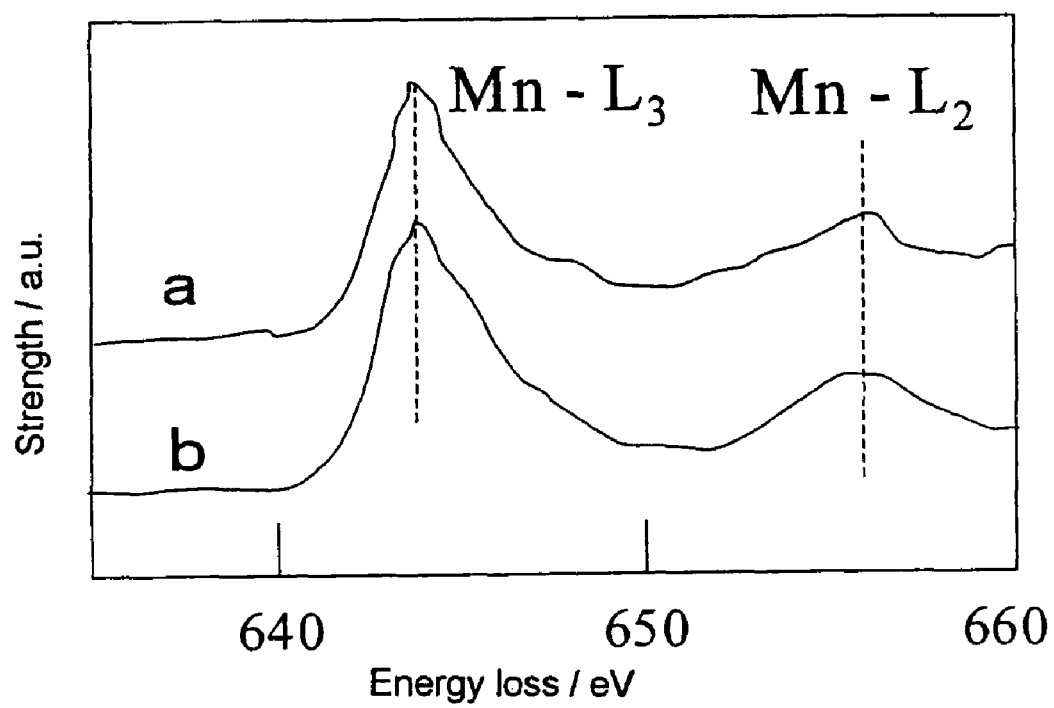
FIG. 13 is a diagram illustrating the state of ions of the Mn element in the wiring main body and the barrier layer described in Example 7 in the second embodiment of this invention.
Figure 14:
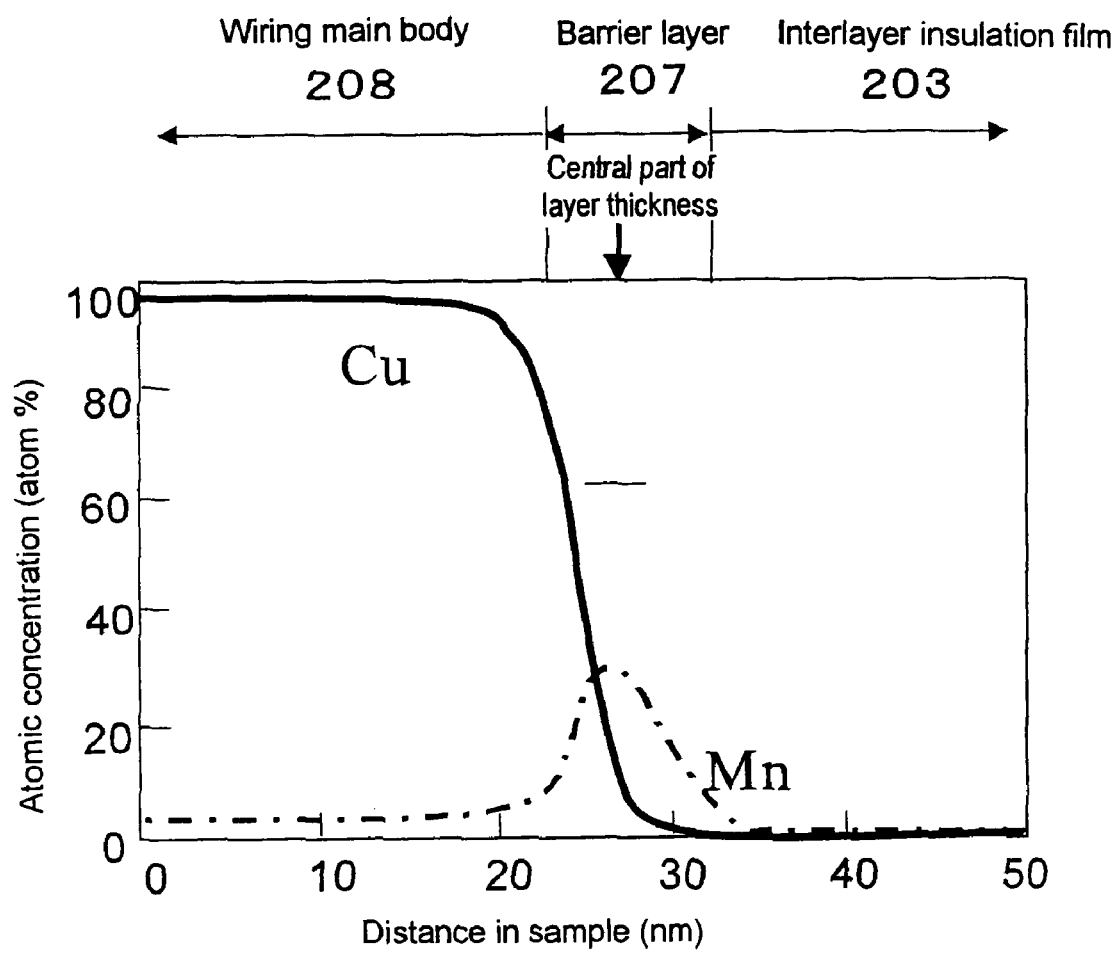
FIG. 14 is a view illustrating the results of the elementary analysis of the barrier layer described in Example 7 in the second embodiment of this invention.

FIG. 10 is a schematic cross section illustrating the internal structure of a wiring groove (opening) in a state resulting from depositing a Cu—Mn alloy film and then depositing a Cu embedded layer. FIG. 11 is a cross section illustrating the structure of the inside of the wiring groove in a state resulting from subjecting the Cu—Mn alloy film and the Cu embedded layer in the wiring groove to heat treatment. FIG. 12 is a transmission electron micrograph of the cross section of the barrier layer. FIG. 13 is a diagram illustrating the state of ions of the Mn element in the wiring main body and the barrier layer. FIG. 14 shows the result of the chemical composition analysis performed on the barrier layer to determine Cu and Mn contents by the electron energy-loss spectroscopy (EELS).

As illustrated schematically in FIG. 10, an insulating film 203 having a thickness of 150 nm, made of $SiO_2$ and intended as an interlayer insulation layer was formed by the ordinary chemical vapor deposition method on the surface of an electroconductive silicon semiconductor layer 202 formed on a silicon substrate 201, a wiring groove (opening) 204 was dug into the insulating film 203, and a Cu—Mn alloy film 205 was deposited on the lateral walls in the wiring grove 204 and on the surface thereof. The lateral width (opening width) W of the wiring groove 204 was 90 nm. The Cu—Mn alloy film 205 was formed by sputtering a target material made of Cu—Mn alloy containing Mn in an atomic concentration of 7% in an ordinary high-frequency sputtering device. By the EELS, the ratio of atomic concentration of Mn in the produced Cu—Mn alloy film 205 was determined to be about 5%. The thickness of the Cu—Mn alloy film 205 was such as to measure 80 nm when it was formed on the flat surface of an Si substrate.

Next, Cu was deposited on the surface of the Cu—Mn alloy film 205 by the electrolytic plating method while using as a seed layer the Cu—Mn alloy film 205 formed by the sputtering method, with the result that a Cu embedded layer 206 was formed in the wiring groove 204 (refer to FIG. 8).

Then, the structure provided inside the wiring groove 204 of the insulating film 203 with the Cu—Mn alloy film 205 and the Cu embedded layer 206 was heat-treated in an argon (Ar) atmosphere containing oxygen in a volume ratio of 25 vol. ppm at a temperature of 400° C. over a period of 30 minutes. The rate of temperature increase from room temperature to the temperature of heat treatment, i.e. 400° C., was fixed at 8° C. per minute. The average rate of temperature decrease from 400° C. to room temperature after completion of the heat treatment was fixed at 10° C. per minute. Consequently, the Cu—Mn alloy film 205 thermally diffused the Mn atoms contained therein toward the interface thereof with the insulating film 203, with the result that a barrier layer 207 formed of an Mn-based oxide was formed in the region near the interface as illustrated in FIG. 11. The barrier layer 207 formed by the heat treatment in the present example had a thickness of 5 nm.

The transmission electron micrograph of the barrier layer 207 subsequent to undergoing the heat treatment is shown in FIG. 12. FIG. 12 clearly shows that a random texture peculiar to amorphousness was formed in the barrier layer 207.

The electron energy-loss spectroscopic (EELS) spectra of Mn were obtained from the regions a and b illustrated in FIG. 12. The results of the analysis are shown in FIG. 13. In FIG. 12, the region a adjoins the barrier layer 207 in a wiring main body 108 and the region b formed the central part of the barrier layer 207. Referring to FIG. 13, the Mn spectrum from the region a was observed to possess a peak strength at the same energy position as the Mn spectrum from the central part of the barrier layer 207 of the region b. This fact allowed confirmation that the Mn present in the region adjoining the barrier layer 207 of the wiring main body 208 possessed the same valence as in the central part of the barrier layer 207 and was ionized to divalence or trivalence.

By the ordinary SIMS, it was confirmed that the barrier layer 207 contained Cu in the interior thereof. The concentration of the Cu atoms was confirmed to decrease monotonously from the wiring main body 208 side toward the insulating film 203 side.

The results of the analysis of the barrier layer 207 conducted by the electron energy-loss spectroscopy (EELS) to determine the distribution of elements therein are shown in FIG. 14. This EELS was performed using a field-emission transmission electron microscope of high resolution, with the field scanned with electron beams spaced 0.2 nm apart. As clearly noted from FIG. 14, the Mn concentration was maximized in the central part in the direction of thickness of the barrier layer 207. Also in the EELS, it was confirmed that the Cu concentration decreased monotonously from the side of the film (wiring main body 208) maid mainly of Cu toward the insulating film 203 ($SiO_2$ film) side. Further, the atomic concentration of Cu was less than the atomic concentration of Mn in the central part in the direction of thickness of the barrier layer 207.

Owing to the heat treatment mentioned above, the Cu—Mn alloy film 205 that allowed expulsion of the Mn by diffusion and that was eventually occupied wholly by Cu and the Cu embedded layer 206 were integrated to give rise to the wiring main body 208. In consequence of the heat treatment, an Mn-based oxide coat was formed also on the surface layer part constituting the upper side of the wiring main body 208 (not shown in FIG. 11). The Mn-based oxide coat in the upper surface layer part was removed by the chemical mechanical polishing (abbreviation: CMP) method. The surface of the Cu wiring main body 208 was exposed and then the Cu wiring main body 208 was tested for electric resistivity. The electric resistivity of the Cu wiring main body 208 was extremely low and reached 2.5 μIΩ·cm, i.e. a level approximately equal to that of the wiring formed by embedding pure Cu in the wiring groove having an opening width of 90 nm.

Thus, according to Example 7 of this invention, the amorphous barrier layer still more effective for suppressing diffusion enabled the production of the Cu wiring exhibiting low resistance approximating close to that of the wiring made of pure Cu. The barrier layer further enabled the insulating property of the insulating film to be enhanced, allowed the production of a wiring that had the benefit of low resistance and possessed the ability to prevent the leakage of the device operating current, and granted the semiconductor device low electric power consumption. Further, owing to the enhancement of adhesiveness between the barrier layer and the wiring main body and the enhancement of adhesiveness between the barrier layer and the insulating film, the semiconductor device was enabled to excel in the reliability of operation over a long period of time.

Since the Cu wiring of the construction conforming to this invention was endowed with low resistance convenient for the efficient flow of the device operating current and provided with an Mn-based oxide coat capable of sufficiently fulfilling the function as a barrier layer, it could avoid the leakage of the device operating current and could be favorably utilized for constructing the electronic device of low electric power consumption. It could be utilized for constructing electronic devices, such as liquid crystal display (LCD), flat display panel (abbreviation: FDP), organic electroluminescence (abbreviation: EL) device and inorganic EL device, for example.

The Mn-based oxide coat possessing the distribution of atomic concentration of Mn disclosed by this invention can function as the barrier layer in the form of a thin film without daring the formation of a barrier layer having a large thickness from the Ta-based material as observed heretofore and, therefore, can be utilized for constructing a silicon LSI having such a small wiring width as not more than 90 nm for the sake of enabling integration in a high density.

The wiring conforming to this invention is composed of a wiring main body of low resistance and a barrier layer convenient for preventing leakage of the device operating current and, therefore, can be utilized for constructing a power device made of silicon or silicon germanium (SiGe) and required to flow a large device operating current.

Now, the sputtering target material that is used in depositing the Cu alloy film 5 on the insulating film 3 in the first and second embodiments described above will be described. Incidentally, the composition of the Cu alloy film 5 formed by sputtering the sputtering target material and the composition of the used sputtering target material are approximately identical.

The sputtering target material to be used for depositing the Cu alloy film 5 is composed of copper (Cu) as a main component and manganese (Mn) as an essential element. This target material contains the impurities that inevitably remain in Cu besides the essential component. The present inventor has found that the impurities inevitably contained in the sputtering target material entail the following disadvantages.

(a) When an unavoidable impurity requiring large negative free energy for the formation of an oxide and exhibiting a high binding reactivity with oxygen is present in the Cu alloy film, this unavoidable impurity is readily combined with oxygen to form an oxide and is finally incorporated in the wiring main body to heighten the electric resistivity of the wiring main body.

(b) When an unavoidable impurity whose diffusion coefficient in Cu is smaller than the Cu's own diffusion coefficient is present in the Cu alloy film, this unavoidable impurity has a strong inclination to remain in Cu because of its slow diffusion in Cu and, consequently, is eventually incorporated into the wiring main body to heighten the electric resistivity thereof.

(c) When an unavoidable impurity that forms an intermetallic compound with Cu is present in the Cu alloy film, this unavoidable impurity is eventually incorporated into the wiring main body to heighten the electric resistivity thereof.

(d) When an unavoidable impurity that forms an intermetallic compound with Mn is present in the Cu alloy film, this unavoidable impurity is eventually incorporated into the wiring main body to heighten the electric resistivity thereof.

This invention, therefore, specifies the unavoidable impurities that entail the disadvantages enumerated above and prescribes rules for ensuring substantial exclusion of these impurities. The wiring main body formed from the sputtering target material, therefore, enabled fabrication of a semiconductor device that had the benefit of low resistance, good conductivity and low electric power consumption.

This sputtering target material is composed, as described above, of Cu as a main component, Mn as an essential element and the unavoidable impurities inevitably remaining in the residual Cu excluding the essential element.

The content of Mn as the essential element is preferred to be not less than 0.5% and not more than 20% of the whole Cu alloy in terms of atomic concentration for the following reason. If this content falls short of 0.5%, the shortage will scarcely allow the formation of a barrier layer not more than 1 nm in thickness in part of the interface and will prevent the acquisition of diffusion-barrier property and adhesiveness of the interface because of the insufficient supply of Mn necessary for forming the barrier layer. If the content exceeds 20%, the excess will cause the barrier layer to acquire a thickness of not less than 10 nm and prevent the barrier layer from obtaining superiority to the barrier layer such as Ta prevailing at present.

The essential element may be made to contain therein together with Mn at least one of the elements comprising zinc (Zn), germanium (Ge), strontium (Sr), silver (Ag), cadmium (Cd), indium (In), tin (Sn), barium (Ba), praseodymium (Pr) and neodymium (Nd), i.e. the elements fated to form a solid solution in Cu as the main component. These solid-solution elements possess diffusion constants equal to or larger than Cu's own diffusion coefficient and are more liable to oxidation than Cu and, therefore, enables the Mn-based oxide coat as the barrier layer to be improved in barriering property against Cu being diffused from the wiring main body side and in adhesiveness with the insulating film and as well enables the semiconductor device to acquire excellent reliability of operation over a long period of time.

In the present invention, the unavoidable impurities consist of one of eight groups in a total content of not more than 0.1% as an atomic concentration based on the whole of the target material, the first group consisting of lithium (Li), the second group consisting of beryllium (Be), calcium (Ca) and magnesium (Mg), the third group consisting of boron (B), gallium (Ga) and aluminum (Al), the fourth group consisting of silicon (Si), the fifth group consisting of antimony (Sb), the sixth group consisting of principal transition metals including scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), tantalum (Ta), tungsten (W), rhenium (Re), osmium (Os), iridium (Ir), platinum (Pt) and gold (Au), the seventh group consisting of inner transition metals of lanthanide series including lanthanum (La), cesium (Ce), samarium (Sm), gadolinium (Gd), terbium (Tb), dysprosium (Dy), holmium (Ho), erbium (Er), thulium (Tm), ytterbium (Yb) and lutetium (Lu), and the eighth group consisting of thorium (Th).

Thus, the sputtering target material of this invention ultimately augments the electric resistivity of the wiring main body vainly. It is directed to defining the concentrations of (a) an impurity element possessing large free energy for forming the oxide and exhibiting a high affinity with oxygen, (b) an impurity element whose diffusion coefficient in Cu is larger than Cu's own diffusion coefficient, (c) an impurity element forming an intermetallic compound with Cu and (d) an impurity element for forming an intermetallic compound with Mn. According to the definition of these concentrations, the concentration of the specific element that chemically reduces the interlayer insulation film 3 made of $SiO_2$ will be defined and the concentration of the element that raises the electric resistivity per 1% of Cu in terms of atomic concentration beyond 5 $\mu\Omega$cm will be defined.

Lithium (Li) that constitutes the first group belongs to Group I in the periodic table of the elements. The sputtering target material does not contain this element. If it contains the element, the content thereof is preferred to be not more than 0.1% in atomic concentration. The words "not contain" as used herein refer to the concentration that falls short of the minimum limit of detection from the standpoint of analysis.

Group I elements, particularly Li, exhibit large solid solubility in Cu, have an inclination to augment the electric resistivity of Cu (wiring main body 8) by remaining therein, and possess the possibility of suddenly decreasing the liquidus-line temperature in proportion to the increase of the Li concentration and inducing the exudation of liquid during the course of process.

As the minimum limit of detection of Li by the flameless atomic absorption spectrometry, $3\times10^{-5}$ µg/ml has been cited (refer to "High-Sensitivity Atomic Absorption and Emission Spectrometry," written jointly by Kazuo Yasuda and Kichinosuke Hirokawa, published by Kodansha Ltd. on Jul. 10, 1976, first edition, p. 103). Then, as the minimum limit of detection of Li in the flame emission spectrometry, $3\times10^{-5}$ µg/ml has been cited (refer to "High-Sensitivity Atomic Absorption and Emission Spectrometry," mentioned above, p. 103). The conversion of the weight concentration to the atomic concentration is accomplished by using the atomic weights of the relevant atoms (6.9 in the case of Li).

Beryllium (Be), calcium (Ca) and magnesium (Mg) that constitute the second group belong to Group II in the periodic table of the elements. The sputtering target material does not contain these elements. If it contains these elements, the total content of these elements is preferred to be not more than 0.1% as atomic concentration.

The Be, Ca and Mg possess high reactivity with oxygen. If the sputtering target material contains these elements in a total atomic concentration exceeding 0.1%, the concentrations of the oxides containing these elements will increase conspicuously in the Cu alloy film 5. Since these oxides augment the electric resistivity of the Cu alloy, the Cu alloy film 5 convenient for producing the Cu film (wiring main body 8) of high conductivity will not be obtained eventually. Conversely, if the atomic concentrations of these individual elements are suppressed below 0.1%, the Cu alloy film advantageous for producing a Cu film (wiring main body 8) of high conductivity will be stably obtained and enabled to suppress the action of chemically reducing a compound, such as $SiO_2$, which forms an interlayer insulation film 3. Consequently, this suppression of the atomic concentrations will be at an advantage in decreasing the amount of Si atoms invading the Cu film (wiring main body 8) formed from the Cu alloy film 5 and augmenting the electric resistivity thereof and in allowing stable formation of the Cu film (wiring main body 8) of high conductivity.

Here, as the minimum limit of detection of Be by the high-frequency plasma spectrometry, $2\times10^{-4}$ µg/ml has been cited (refer to "High-Sensitivity Atomic Absorption and Emission Spectrometry" mentioned above, p. 102). Then, as the minimum limit of detection of Ca by the flameless atomic absorption and emission spectrometry, $5.3\times10^{-4}$ µg/ml has been cited (refer to "High-Sensitivity Atomic Absorption and Emission Spectrometry" mentioned above, p. 102). As the minimum limit of detection of Mg by the flameless atomic absorption and emission spectrometry, $2.8\times10^{-6}$ µg/ml has been cited.

Boron (B), gallium (Ga) and aluminum (Al) constituting the third group belong to the Group III in the periodic table of the elements. The sputtering target material does not contain these elements. If it contains these elements, the total atomic concentrations of these elements are preferred to be not more than 0.1%.

If the atomic concentrations of the individual elements B, Ga and Al constituting the third group total not more than 0.1%, it will be rendered possible to obtain the Cu alloy film 5 capable of producing a Cu film (wiring main body 8) of high conductivity. Since the B, Ga and Al have larger free energy changes for the formation of oxides or larger enthalpy changes than the Si oxides, for example, they exhibit higher degrees of reactivity with oxygen. If oxides containing these elements are formed copiously, it will not be rendered possible to attain stable acquisition of the Cu alloy film 5 of good conductivity. The oxides containing these elements and formed in the Cu alloy film 5 are eventually incorporated in the Cu film and suffered to hinder stable formation of the Cu film (wiring main body 8) of high conductivity.

The concentrations of the oxides formed in the Cu alloy film 5 are vainly increased in proportion as the contents of B, Ga and Al in the sputtering target material increase. Since the boron (B) has a melting point (=2027° C.) higher than the melting point of Cu (=1082° C.) and a diffusion coefficient smaller than Cu's own diffusion coefficient, nearly whole of the formed boron oxide remains in the Cu alloy film 5. This fact results in hindering stable formation of the Cu film (wiring main body 8) of high conductivity. When the atomic concentrations of B, Ga and Al are made to total not more than 0.1%, therefore, this restriction results in favoring stable formation of the Cu film (wiring main body 8) of high conductivity.

Here, as the minimum limit of detection of B by the high-frequency plasma spectrometry, $8\times10^{-2}$ µg/ml has been cited (refer to "High-Sensitivity Atomic Absorption and Emission Spectrometry" mentioned above, p. 102). Then, as the minimum limit of detection of Ga by the flame emission spectrometry, 0.1 µg/ml has been cited (refer to "High-Sensitivity Atomic Absorption and Emission Spectrometry" mentioned above, p. 102). As the minimum limit of detection of Al by the high-frequency plasma spectrometry, $2\times10^{-4}$ µg/ml has been cited (refer to "High-Sensitivity Atomic Absorption and Emission Spectrometry" mentioned above, p. 102).

Silicon (Si) constituting the fourth group belongs to the Group IV in the periodic table of the elements. The sputtering target material does not contain this element. If it contains this element, the atomic concentration of the element is preferred to be not more than 0.1%.

If the atomic concentration of Si exceeds 0.1%, the excess will exhibit the action of increasing the electric resistivity of the Cu film (wiring main body 8) and result in disabling stable formation of the Cu film (wiring main body 8) of low resistance.

Here, as the minimum limit of detection of Si by the high-frequency plasma spectrometry using the absorbance at a wavelength of 256.1 nm, $9.4 \times 10^{-2}$ μg/ml has been cited (refer to "High-Sensitivity Atomic Absorption and Emission Spectrometry" mentioned above, p. 104.)

Antimony (Sb) constituting the fifth group belongs to the Group V in the periodic table of the elements. The sputtering target material does not contain this element. When it contains the element, the atomic concentration of the element is preferred to be not more than 0.1%.

If the atomic concentration of Sb exceeds 0.1%, the excess will possess the action of increasing the electric resistivity of the Cu film (wiring main body 8) and result in disabling stable formation of the Cu film (wiring main body 8) of good conductivity.

Here, as the minimum limit of detection of Sb by the flameless atomic absorption spectrometry, $5 \times 10^{-3}$ μg/ml has been cited (refer to "High-Sensitivity Atomic Absorption and Emission Spectrometry" mentioned above, p. 104.)

The terms "individual principal transition metals including scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), tantalum (Ta), tungsten (W), rhenium (Re), osmium (Os), iridium (Ir), platinum (Pt) and gold (Au) constituting the sixth group" as used herein refer to the group of elements possessing a d shell (electron orbit) destitute of the packing of outer shell electrons (refer to "Duffy Inorganic Chemistry," printed by Hirokawa-Shoten Ltd., published on Apr. 15, 1971, $5^{th}$ edition, p. 205). The sputtering target material does not contain these elements. If it contains the elements, the total concentration of these elements is preferred to be not more than 0.1%.

These principal transition metals exhibit low diffusion speeds in Cu. In the Cu alloy film 5, the Cu and the insulating layer are mutually diffused to degrade the special quality of the insulating film before these elements reach the interface in a sufficient amount. If the total concentration of these principal transition metals exceeds 0.1% as an atomic concentration, these elements have a strong inclination to remain in Cu because of the slowness of their diffusion in Cu and add to the electric resistivity of the Cu wiring. Further, since these elements form intermetallic compounds with Mn, they are at a disadvantage in manifesting the action of preventing Mn from diffusing in the interface and the surface and forming an electrically insulating film.

By using the sputtering target material that has the total content of these main transient metals below 0.1%, therefore, it is rendered possible to induce diffusion of Mn to the interface and the surface and promote the formation of an electrically insulating layer and contribute to excluding the elements liable to heighten the electric resistivity of the wiring main body 8.

Here, as the minimum limit of detection of Ti by the high-frequency plasma spectrometry, $2 \times 10^{-4}$ μg/ml has been cited (refer to "High-Sensitivity Atomic Absorption and Emission Spectrometry" mentioned above, p. 104). Then, as the minimum limit of detection of Fe by the flameless atomic absorption spectrometry, $1 \times 10^{-4}$ μg/ml has been cited and by the high-frequency plasma spectrometry, $3 \times 10^{-4}$ μg/ml has been cited (refer to "High-Sensitivity Atomic Absorption and Emission Spectrometry" mentioned above, p. 102). The minimum limits of detection of the other principal transition metals are illustrated together with the definitions of minimum limits of detection in the publicly known technical literature ("High-Sensitivity Atomic Absorption and Emission Spectrometry" mentioned above, pp. 101-106, for example).

The terms "inner transition metals of lanthanide series, such as lanthanum (La), cesium (Ce), samarium (Sm), gadolinium (Gd), terbium (Th), dysprosium (Dy), holmium (Ho), erbium (Er), thulium (Tm), ytterbium (Yb) and lutetium (Lu) that constitute the seventh group" refer to the group of elements bearing atomic numbers 57 to 71 (refer to "Duffy Inorganic Chemistry" mentioned above, pp. 262-263). The sputtering target material does not contain these elements. If it contains these elements, the total atomic concentration of these elements is preferred to be not more than 0.1%.

If the total content of these elements is not more than 0.1% as atomic concentration, the shortage will enable preventing their formation of intermetallic compounds with Cu and contribute to the formation of a Cu film (wiring main body 8) of low resistance.

Here, as the minimum limit of detection of La by the high-frequency plasma spectrometry, $4 \times 10^{-4}$ μg/ml has been cited ("High-Sensitivity Atomic Absorption and Emission Spectrometry" mentioned above, p. 103). Then, as the minimum limit of detection of Ce by the same spectrometry, $2 \times 10^{-3}$ μg/lm has been cited ("High-Sensitivity Atomic Absorption and Emission Spectrometry" mentioned above, p. 102). The information concerning the minimum limits of detection of other inner transition metals of lanthanide series can be acquired from the technical literature (such as, for example, "High-Sensitivity Atomic Absorption and Emission Spectrometry" mentioned above, pp. 101-106).

Thorium (Th) constituting the eighth group is one kind of inner transition metals of actinide series ("Duffy Inorganic Chemistry," pp. 265-267). The sputtering target material does not contain this element. If it contains this element, the atomic concentration thereof is preferred to be not more than 0.1%.

If the content of Th is not more than 0.1%, the shortage will prevent the element from forming an intermetallic compound with Cu and contribute to the formation of a Cu film (wiring main body 8) of low resistance.

Here, as the minimum limit of detection of Th by the plasma jet method ("High-Sensitivity Atomic Absorption and Emission Spectrometry" mentioned above, pp. 21-23), 2 μg/ml has been cited ("High-Sensitivity Atomic Absorption and Emission Spectrometry" mentioned above, p. 104).

The sputtering target material contemplated by this invention that has the contents of the specific elements (first to eighth groups mentioned above) prescribed to be at low levels can be formed by molding or processing in the shape of a sheet a Cu alloy resulting from adding Mn of purity exceeding 99.999% (5N) to Cu of purity exceeding 99.9999% (6N), without reference to the method of manufacture or the method of purification. As the Mn of high purity, the purified Mn that is obtained by the chelate resin ion-exchange method, electric field processing or vacuum method for sublimation refining, for example, and consequently purified till a total content of metallic impurities reaches not more than 200 ppm and a total content of nonmetallic impurities reaches not more than 10 ppm can be used (refer to JP-A 2002-285373). Then, the Cu—Ge alloy, for example, can be produced by adding high-purity Ge of the semiconductor grade to a high-purity Cu having purity of not less than 99.9999% (6N).

The concentrations in the sputtering target material of the specific elements contemplated by this invention can be determined by various high-sensitivity analytical means. They can be determined by means, such as flameless atomic absorption spectrometry, high-frequency plasma spectrometry and mass spectrometry, for example. The quantitative analysis is preferably performed with a means chosen on account of high minimum limit of detection (meaning that the determination can be effected even at a low concentration) found for each of the elements subjected to analysis. With respect to Ni, while the minimum limit of detection by the high-frequency plasma spectrometry is $4.0 \times 10^{-4}$ µg/ml, the minimum limit of detection by the flameless atomic absorption spectrometry is $7.3 \times 10^{-5}$ µg/ml (refer to "High-Sensitivity Atomic Absorption and Emission Spectrometry" mentioned above, page 103). Concerning Ni, the determination is performed more advantageously by the flameless atomic absorption spectrometry than by the high-frequency plasma spectrometry.

The Cu alloy manufactured by adding Mn of high purity to Cu of high purity can be utilized not only as the sputtering target material, but also as the vacuum deposition source for the construction of the wiring made mainly of Cu and as film-forming target materials befitting a certain method other than the sputtering method. For example, it can be utilized as the target material for the laser ablation method that is one of the methods for forming the Cu alloy film 5. It can be utilized as the film-forming target materials for the ion plating method, ion cluster beam method and plasma reaction method.

Since the sputtering target material contemplated by this invention has the benefit of high purity resulting from prescribing its contents of the specific elements to be set at low levels, it suppresses the occurrence of abnormal electric discharge during the course of sputtering and consequently induces the effect of enabling stable production of the Cu film (wiring main body 8) constituting the wiring main body that contains voids scarcely, exhibits a homogeneous texture and possesses a uniform thickness and of a barrier layer 7 that possesses a uniform thickness as well.

The foregoing description has assumed that where the unavoidable impurities are the specified elements constituting the first group through the eighth group, the total content of such unavoidable impurities in each group is prescribed to be not more than 0.1% of the sputtering target material. Instead of prescribing the total content for each group to be not more than 1%, the total content of the specific unavoidable impurities may be prescribed to be not more than 0.1%. By thus prescribing, it is rendered possible to allow prescribing the unavoidable impurities to be still lower levels, enable the wiring main body formed from the sputtering target material to have the benefit of low resistance and good conductivity, and ensure the effect of producing a semiconductor device endowed with low electric power consumption.

Incidentally, this invention can be widely applied to semiconductor devices, flat display panels, such as a liquid crystal display device provided with a semiconductor device or an organic or inorganic electroluminescence (abbreviation: EL) display device, and sputtering target materials for the formation of a wiring in other electronic devices provided with a Cu wiring structure.

The Cu wiring structure fabricated by using the sputtering target material contemplated by this invention is not restricted to the Damascene wiring structure described above but can be applied to various wiring structures.

Example 8

The contents of this invention will be described in detail below citing, for example, the case of the Cu wiring that befits use in the silicon (Si) semiconductor device.

Figure 15:
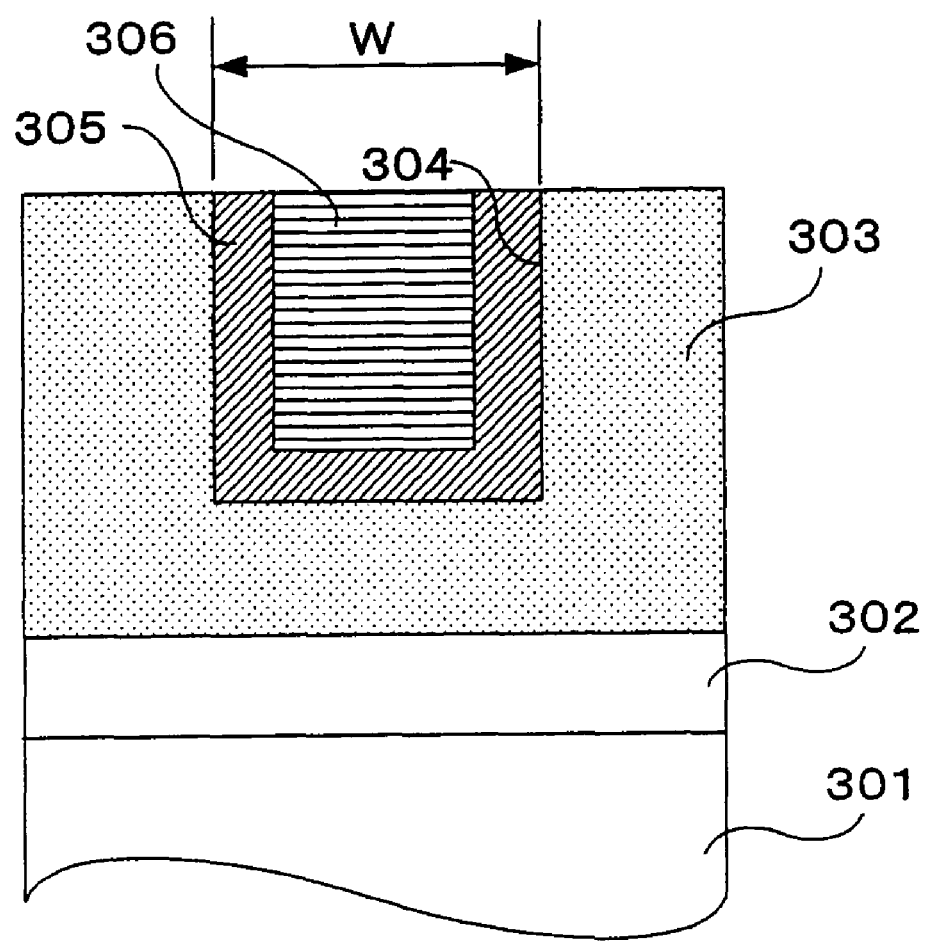
FIG. 15 is a schematic cross section illustrating the construction of the inner part of the wiring groove in the former half of the procedure of fabrication of the semiconductor device in Example 8.
Figure 16:
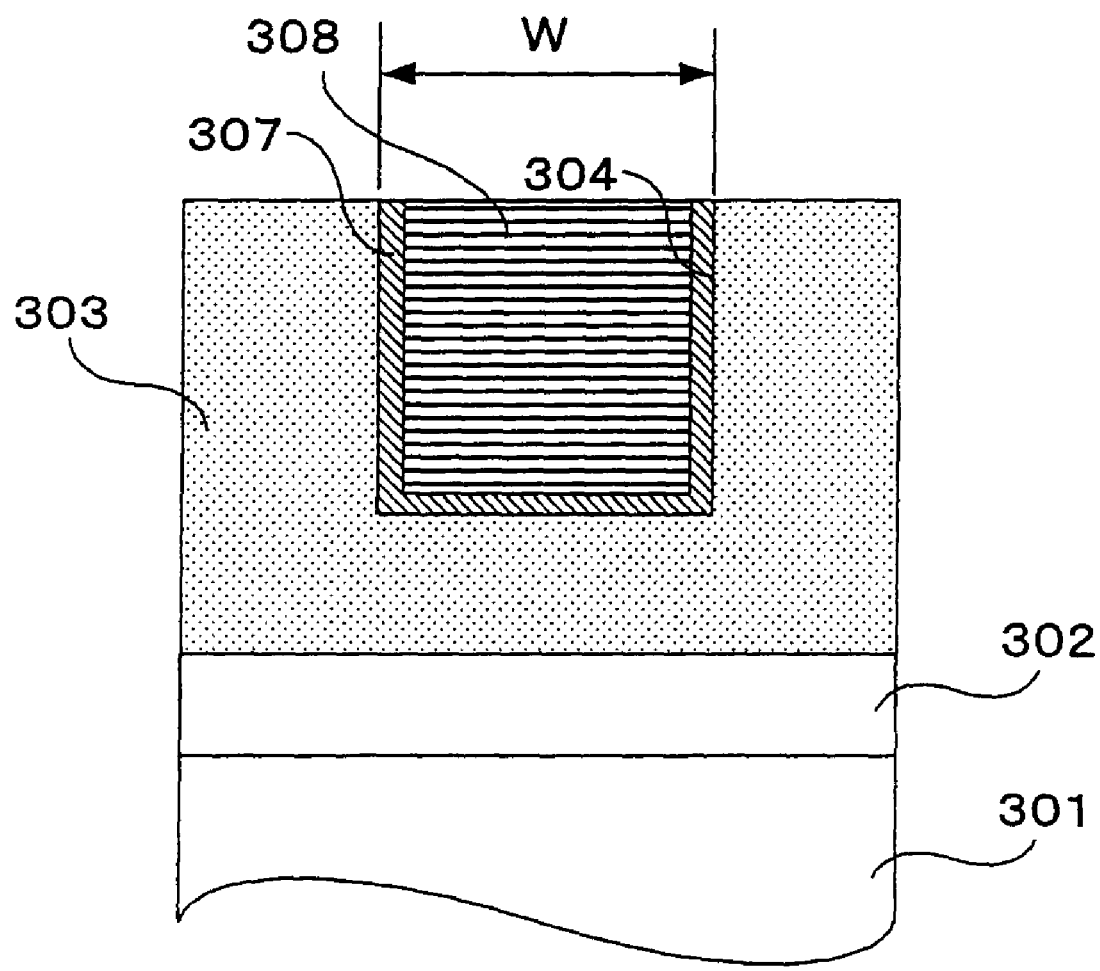
FIG. 16 is a schematic cross section illustrating the construction of the inner part of the wiring groove in the latter half of the procedure of fabrication of the semiconductor device in Example 8.

FIG. 15 is a schematic view illustrating the inner structure of the wiring groove (opening) in a state resulting from depositing a Cu alloy film and then depositing a Cu embedded layer. FIG. 16 is a cross section illustrating the structure of the interior of the wiring groove in a state resulting from heat-treating the Cu alloy film and Cu embedded layer in the wiring groove.

As illustrated schematically in FIG. 15, an insulating film 303 having a thickness of 150 nm, made of $SiO_2$ and intended as an interlayer insulation layer was formed by the ordinary chemical vapor phase growth method on the surface of an electroconductive silicon semiconductor layer 302 formed on a silicon substrate 301, a wiring groove (opening) 304 was dug into the insulating film 303, and a Cu—Mn alloy film 305 was deposited on the lateral walls in the wiring grove 304 and on the surface thereof. The lateral width (opening width) W of the wiring groove 304 was 32 nm. The Cu—Mn alloy film 305 was formed by sputtering a sputtering target material contemplated by this invention and made of Cu—Mn alloy containing Mn in an atomic concentration of 4% in an ordinary high-frequency sputtering device. The thickness of the Cu—Mn alloy film 305 was such as to measure 30 nm when it was formed on the flat surface of an Si substrate.

The sputtering target material of the present invention was obtained through molding of a Cu alloy, and the unavoidable impurities contained in the sputtering target material consisted of any one of the eight groups, the first group consisting of lithium (Li), the second group consisting of beryllium (Be), calcium (Ca) and magnesium (Mg), the third group consisting of boron (B), gallium (Ga) and aluminum (Al), the fourth group consisting of silicon (Si), the fifth group consisting of antimony (Sb), the sixth group consisting of principal transition metals including scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), tantalum (Ta), tungsten (W), rhenium (Re), osmium (Os), iridium (Ir), platinum (Pt) and gold (Au), the seventh group consisting of inner transition metals of lanthanide series including lanthanum (La), cesium (Ce), samarium (Sm), gadolinium (Gd), terbium (Th), dysprosium (Dy), holmium (Ho), erbium (Er), thulium (Tm), ytterbium (Yb) and lutetium (Lu), and the eighth group consisting of thorium (Th). The content of the unavoidable impurities was, group by group, in a total of not more than 0.1% as an atomic concentration based on the whole of the target material.

Next, Cu was deposited on the surface of the Cu—Mn alloy film 305 by the electrolytic plating method while using as a seed layer the aforementioned Cu—Mn alloy film 305 formed by the sputtering method, with the result that a Cu embedded layer 306 was formed in the wiring groove 304 (refer to FIG. 15).

Then, the structure provided inside the wiring groove 304 of the insulating film 303 with the Cu—Mn alloy film 305 and the Cu embedded layer 306 was heat-treated in an argon (Ar) atmosphere containing oxygen in a volume ratio of 10 ppm at a temperature of 300° C. over a period of 15 minutes. The rate of temperature increase from room temperature to the temperature of heat treatment, i.e. 300° C., was fixed at 8° C. per minute. The average rate of temperature decrease from 300° C. to room temperature after completion of the heat treatment was fixed at 10° C. per minute. Consequently, the Cu—Mn alloy film 305 thermally diffused the Mn atoms contained therein toward the interface thereof with the insulating film 303, with the result that a barrier layer 307 formed of an Mn-based oxide was formed in the region near the interface as illustrated in FIG. 16. The barrier layer 307 formed by the heat treatment in the present example had a thickness of 4 nm.

By the ordinary secondary ion mass spectroscopy (SIMS), it was confirmed that the interior of the barrier layer 307 contained Cu similarly to the second embodiment described above and that the concentration of Cu atoms of the barrier layer 307 was monotonously decreased from the wiring main body side 308 side toward the side of the interlayer insulation film 303. In consequence of the heat treatment, the Cu—Mn alloy film 305 that expelled Mn by diffusion and was consequently occupied nearly wholly by Cu and the Cu embedded layer 306 were integrated to form the wiring main body 308. The electric resistivity of the wiring main body 308 was extremely low and reached 4.0 µΩcm, a level approximately equaling that of the wiring formed by embedding pure Cu in the wiring groove having an opening width of 32 nm., as follows:

Example 9

The unavoidable impurities contained in the sputtering target material of Example 9 were lithium (Li) constituting the first group, beryllium (Be), calcium (Ca) and magnesium (Mg) constituting the second group, boron (B), gallium (Ga) and aluminum (Al) constituting the third group, silicon (Si) constituting the fourth group, antimony (Sb) constituting the fifth group, the principal transition metals, i.e. titanium (Ti), vanadium (V), chromium (Cr), iron (Fe), cobalt (Co), nickel (Ni), zirconium (Zr), molybdenum (Mo), palladium (Pd), tungsten (W), platinum (Pt) and gold (Au), constituting the sixth group, and thorium (Th) constituting the eighth group. The total content of these unavoidable impurities was not more than 0.1% as atomic concentration in each of the groups. The other conditions for the formation of the wiring main body were identical with those used in the procedure of Example 8. The electric resistivity of the wiring main body 308 reached the same level, 4.0 µΩcm, as in Example 8.

Example 10

The unavoidable impurity contained in the sputtering target material in Example 10 was any one of lithium (Li), beryllium (Be), calcium (Ca), magnesium (Mg), boron (B), gallium (Ga), aluminum (Al), silicon (Si), antimony (Sb), scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), Tantalum (Ta), tungsten (W), rhenium (Re), osmium (Os), iridium (Ir), platinum (Pt), gold (Au), lanthanum (La), cesium (Ce), samarium (Sm), gadolinium (Gd), terbium (Th), dysprosium (Dy), holmium (Ho), erbium (Er), thulium (Tm), ytterbium (Yb), lutetium (Lu) and thorium (Th). The total content of the unavoidable impurity was not more than 0.1% as atomic concentration. The other conditions for the formation of the wiring main body were identical with those used in the procedure of Example 8. The electric resistivity of the wiring main body 308 reached 3.8 µΩcm.

In Example 10, the wiring main body 308 could be improved so as to acquire still lower electric resistivity. It is inferred that this improvement resulted from defining the total content of all the impurities instead of defining the content of specific inevitable impurity group by group and consequently lowering the content thereof further.

Example 11

The unavoidable impurities contained in the sputtering target material of Example 11 were lithium (Li), beryllium (Be), calcium (Ca), magnesium (ag), boron (B), gallium (Ga), aluminum (Al), silicon (Si), antimony (Sb), titanium (Ti), vanadium (V), chromium (Cr), iron (Fe), cobalt (Co), nickel (Ni), zirconium (Zr), molybdenum (Mo), palladium (Pd), tungsten (W), platinum (Pt), gold (Au) and thorium (Th). The total content of these unavoidable impurities was not more than 0.1% as atomic concentration. The other conditions for the formation of the wiring main body were identical with those used in the procedure of Example 8. The electric resistivity of the wiring main body 308 reached the same level, 3.8 µΩcm, as in Example 8.

Comparative Example

The unavoidable impurities contained in the sputtering target material in Comparative Example consisted of one (the sixth group in this Comparative Example) of eight groups in a total content exceeding 0.1% as an atomic concentration based on the whole of the target material, the first group consisting of lithium (Li), the second group consisting of beryllium (Be), calcium (Ca) and magnesium (ag), the third group consisting of boron (B), gallium (Ga) and aluminum (Al), the fourth group consisting of silicon (Si), the fifth group consisting of antimony (Sb), the sixth group consisting of principal transition metals including scandium (Sc), titanium (Ti), vanadium (V), chromium (Cr), iron (Fe), cobalt (Co), nickel (Ni), yttrium (Y), zirconium (Zr), niobium (Nb), molybdenum (Mo), technetium (Tc), ruthenium (Ru), palladium (Pd), hafnium (Hf), tantalum (Ta), tungsten (W), rhenium (Re), osmium (Os), iridium (Ir), platinum (Pt) and gold (Au), the seventh group consisting of inner transition metals of lanthanide series including lanthanum (La), cesium (Ce), samarium (Sm), gadolinium (Gd), terbium (Th), dysprosium (Dy), holmium (Ho), erbium (Er), thulium (Tm), ytterbium (Yb) and lutetium (Lu), and the eighth group consisting of thorium (Th). The other conditions for the formation of the wiring main body were identical with those used in the procedure of Example 8. The electric resistivity of the wiring main body reached 5.0 µΩcm. It can be conceived that why the electric resistivity of the wiring main body is increased is to make the content of the specific unavoidable impurities (the sixth group in this Comparative Example) larger.

INDUSTRIAL APPLICABILITY

The semiconductor device conforming to this invention, by being provided with an insulating film containing silicon, a wiring main body formed of copper and a barrier layer formed of an Mn-based oxide, is enabled to secure the insulating property of the insulating film, realize the low resistance of the wiring, augment the adhesiveness between the barrier layer and the insulating film, and produce reliable operation over a long period of time.

The invention claimed is:
1. A semiconductor device comprising: an insulating film including silicon (Si); an interconnection located in a groove disposed on the insulating film the interconnection including copper (Cu); and a barrier layer located between the insulating film and the interconnection, the barrier layer including a manganese (Mn)-based oxide having an atomic concentration of manganese (Mn) maximized in a central part of the barrier layer.

2. A semiconductor device comprising: an insulating film including silicon (Si); an interconnection located in a groove disposed on the insulating film, the interconnection including copper (Cu); and a barrier layer located between the insulating film and the interconnection, the barrier layer containing an oxide including copper (Cu), silicon (Si) and manganese (Mn); wherein the barrier layer is formed by an oxide including copper (Cu), silicon (Si) and manganese (Mn), the barrier layer having atomic concentration of copper (Cu) decreasing from the interconnection side toward the insulating film side, atomic concentration of silicon (Si) decreasing from the insulating film side toward the interconnection side, and atomic concentration of manganese (Mn) maximized in a region in which the atomic concentration of copper (Cu) and the atomic concentration of silicon (Si) are almost the same.

3. The semiconductor device of claim 1, wherein the insulating film includes silicon dioxide ($SiO_2$).

4. The semiconductor device of claim 1, wherein the insulating film includes silicon oxide nitride.

5. The semiconductor device of claim 1, wherein the insulating film includes silicon oxide fluoride.

6. The semiconductor device of claim 1, wherein the insulating film includes silicon oxide carbide.

7. The semiconductor device of claim 1, wherein the insulating film is located on an electroconductive silicon semiconductor film on a silicon substrate.

8. The semiconductor device of claim 1, wherein the interconnection has a manganese (Mn) ion in a side contiguous to the barrier layer, a valence of the manganese (Mn) ion being divalent or trivalent.

9. The semiconductor device of claim 1, wherein electric resistivity of the interconnection is substantially the same as that of a pure copper (Cu) interconnection located in a groove of the same shape.

10. The semiconductor device of claim 1, wherein the barrier layer includes copper (Cu).

11. The semiconductor device of claim 10, wherein the barrier layer has atomic concentration of copper (Cu) decreasing monotonically from the interconnection side toward the insulating film side.

12. The semiconductor device of claim 10, wherein the barrier layer has atomic concentration of copper (Cu) decreasing from the interconnection side toward the insulating film side with a plus or minus sign of a slope of the decrease not changed.

13. The semiconductor device of claim 10, wherein atomic concentration of copper (Cu) in the barrier layer is not more than the atomic concentration of manganese (Mn) in a central part of a thickness of the barrier layer.

14. The semiconductor device of claim 2, wherein the atomic concentration of manganese (Mn) in a region of the barrier layer, in which the atomic concentration of copper (Cu) and the atomic concentration of silicon (Si) are substantially the same, is not less than twice the atomic concentration of copper (Cu) or silicon (Si).

15. The semiconductor device of claim 1, wherein the barrier layer has a thickness of not less than 1 nm, not more than ⅕ of a width of the groove, and not more than 10 nm.

16. The semiconductor device of claim 1, wherein the barrier layer is amorphous.

17. The semiconductor device of claim 1, wherein the barrier layer is located between electric fields formed at the interconnection side and the insulating film side.

18. The semiconductor device of claim 2, wherein the atomic concentration of copper (Cu) decreases from not less than 70 atom % to not more than 10 atom %.

19. The semiconductor device of claim 2, wherein the atomic concentration of silicon (Si) decreases from not less than 30 atom % to not more than 10 atom %.

20. The semiconductor device of claim 1, wherein maximum atomic concentration of manganese (Mn) is not less than 30 atom %.

21. The semiconductor device of claim 2, wherein a silicon (Si) atom exists both in the insulating film and in the barrier layer adjacent to their interface.

22. The semiconductor device of claim 2, wherein a copper (Cu) atom exists both in the insulating film and in the barrier layer adjacent to their interface.

23. The semiconductor device of claim 14, wherein the atomic concentration of manganese (Mn) in a region of the barrier layer, in which the atomic concentration of copper (Cu) and the atomic concentration of silicon (Si) are both less than 15 atom %, is more than 33 atom %.

24. The semiconductor device of claim 1, wherein the groove has an opening width of 90 nm t 5 nm, and the barrier layer has a thickness of 5 nm to 10 nm.

25. The semiconductor device of claim 1, wherein the groove has an opening width of 65 nm±3 nm, and the barrier layer has a thickness of 7 nm±3 nm.

26. The semiconductor device of claim 1, wherein the groove has an opening width of 45 nm±2 nm, and the barrier layer has a thickness of 5 nm±2 nm.

27. The semiconductor device of claim 1, wherein the groove has an opening width of 32 nm±2 nm, and the barrier layer has a thickness of 3.5 nm±1 nm.

28. The semiconductor device of claim 1, wherein the insulating film includes silicon dioxide ($SiO_2$) and has a thickness of 150 nm, the groove has an opening width of 90 nm, the barrier layer has a thickness of approximately 5 nm, and the interconnection has electric resistivity of approximately 2.5 μΩcm.

29. The semiconductor device of claim 28, wherein the barrier layer has atomic concentration of copper (Cu) decreasing monotonically from the interconnection side toward the insulating film side, the barrier layer has atomic concentration of silicon (Si) decreasing monotonically from the insulating film side toward the interconnection side, and manganese (Mn) atoms are concentrically accumulated with the atomic concentration of manganese (Mn) maximized in a region in which the atomic concentration of copper (Cu) and the atomic concentration of silicon (Si) are almost the same.

* * * * *